(12) United States Patent
Takahara

(10) Patent No.: US 9,263,510 B2
(45) Date of Patent: Feb. 16, 2016

(54) EL DISPLAY DEVICE

(71) Applicant: PANASONIC CORPORATION, Osaka (JP)

(72) Inventor: Hiroshi Takahara, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/292,257

(22) Filed: May 30, 2014

(65) Prior Publication Data

US 2014/0264305 A1   Sep. 18, 2014

Related U.S. Application Data

(63) Continuation of application No. PCT/JP2012/007519, filed on Nov. 22, 2012.

(30) Foreign Application Priority Data

Feb. 1, 2012   (JP) ................................. 2012-019474

(51) Int. Cl.
*H05B 33/02* (2006.01)
*H01L 51/52* (2006.01)
*H01L 27/32* (2006.01)

(52) U.S. Cl.
CPC .................................. *H01L 27/3279* (2013.01)

(58) Field of Classification Search
CPC ................................................ H01L 27/3729
See application file for complete search history.

(56) References Cited

U.S. PATENT DOCUMENTS

| 6,894,431 | B2 | 5/2005 | Yamazaki et al. |
| 7,145,289 | B2 | 12/2006 | Yamazaki et al. |
| 7,508,361 | B2 | 3/2009 | Uchino et al. |
| 7,514,864 | B2 | 4/2009 | Yamazaki et al. |
| 8,049,419 | B2 | 11/2011 | Yamazaki et al. |
| 8,149,188 | B2 | 4/2012 | Kishi |
| 8,319,424 | B2 | 11/2012 | Yamazaki et al. |
| 8,716,933 | B2 | 5/2014 | Yamazaki et al. |
| 2001/0015618 | A1 | 8/2001 | Yamazaki et al. |
| 2003/0137325 | A1* | 7/2003 | Yamazaki et al. ............. 327/80 |
| 2004/0263057 | A1 | 12/2004 | Uchino et al. |
| 2005/0156509 | A1 | 7/2005 | Yamazaki et al. |
| 2006/0017665 | A1 | 1/2006 | Ko et al. |

(Continued)

FOREIGN PATENT DOCUMENTS

| CN | 1577458 A | 2/2005 |
| CN | 1662107 A | 8/2005 |

(Continued)

OTHER PUBLICATIONS

International Search Report issued in International Application No. PCT/JP2012/007519 mailed Feb. 5, 2013, with English translation.
Chinese Office Action and Search Report issued in corresponding Chinese Patent Application No. 201280066719.4, mailed on Nov. 30, 2015; with English translation of Search Report.

*Primary Examiner* — Donald Raleigh
(74) *Attorney, Agent, or Firm* — McDermott Will & Emery LLP

(57) ABSTRACT

A EL display device has EL display panel including the a display area where a pixel is arranged in matrix, and a wiring pattern formed in a circumferential portion of the display area and supplying voltage to a pixel. The EL display panel includes a flexible substrate having an electrode connected to a source signal line or a gate signal line arranged thereon. The flexible substrate includes an anode reinforcement wiring and a cathode reinforcement wiring which are electrically parallel to the wiring pattern.

9 Claims, 24 Drawing Sheets

(56) References Cited

U.S. PATENT DOCUMENTS

| | | |
|---|---|---|
| 2006/0125407 A1* | 6/2006 | Jeong .................. 315/169.3 |
| 2006/0250080 A1 | 11/2006 | Yamazaki et al. |
| 2009/0167645 A1 | 7/2009 | Kishi |
| 2009/0189511 A1 | 7/2009 | Yamazaki et al. |
| 2010/0289729 A1 | 11/2010 | Nakamura |
| 2012/0043579 A1 | 2/2012 | Yamazaki et al. |
| 2013/0092911 A1 | 4/2013 | Yamazaki et al. |
| 2014/0225130 A1 | 8/2014 | Yamazaki et al. |

FOREIGN PATENT DOCUMENTS

| | | |
|---|---|---|
| CN | 101405784 A | 4/2009 |
| JP | 2003-167269 A | 6/2003 |
| JP | 2006-039541 A | 2/2006 |
| JP | 2006-049514 A | 2/2006 |
| JP | 2009-109519 A | 5/2009 |
| JP | 2009-229635 A | 10/2009 |
| JP | 2010-060805 A | 3/2010 |
| WO | 2010/001467 A1 | 1/2010 |

* cited by examiner

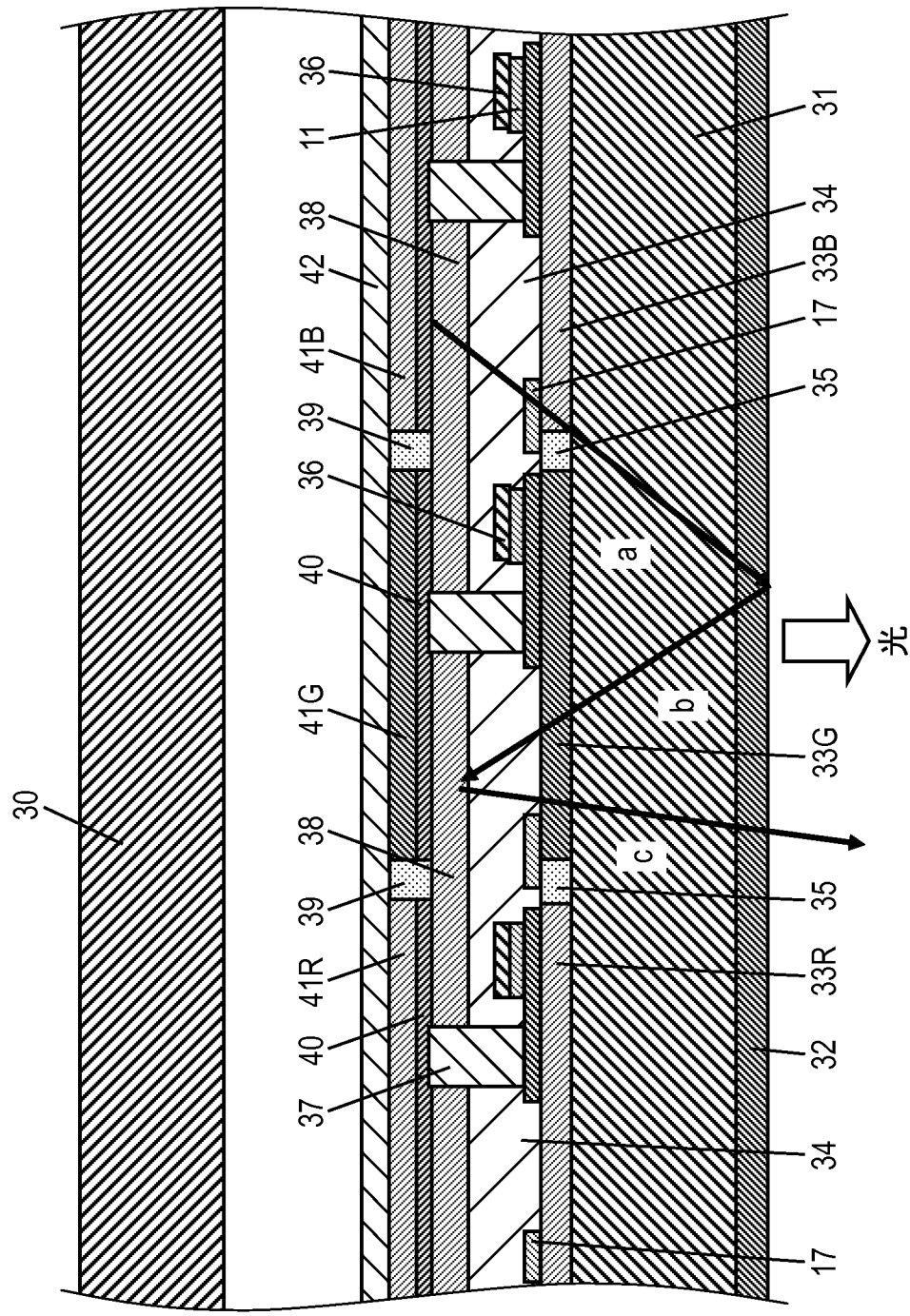

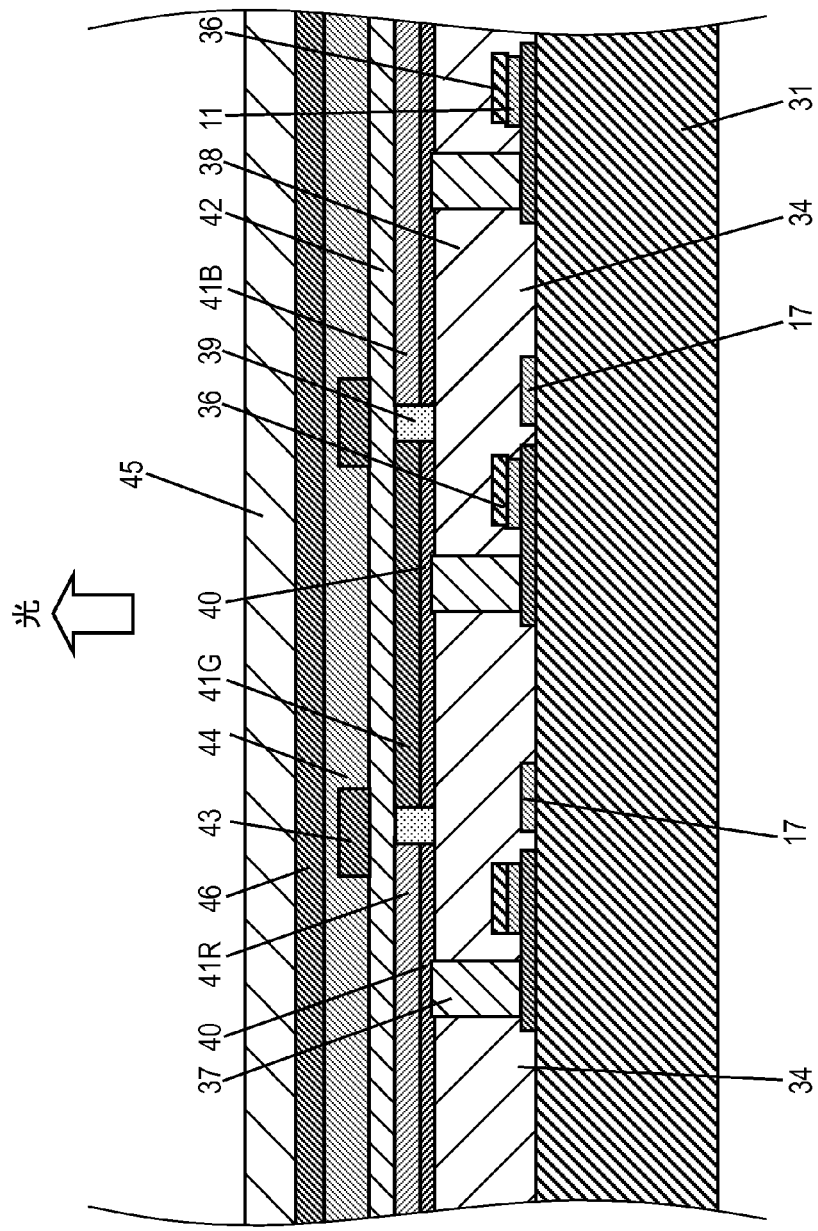

EL DISPLAY DEVICE

RELATED APPLICATIONS

This application is a continuation of International Application No. PCT/JP2012/007519, filed on Nov. 22, 2012, which in turn claims the benefit of Japanese Application No. 2012-019474, filed on Feb. 1, 2012, the disclosures of which are incorporated by reference herein.

TECHNICAL FIELD

The present disclosure relates to an EL (Electro Luminescence) display device having EL elements arranged in matrix and made of organic material as luminescence material.

BACKGROUND

Active-matrix EL display devices having EL elements that are arranged in matrix are commercialized and are used for display panels of smartphones, for example. The EL element has an EL layer formed between an anode electrode and a cathode electrode, and emits light by a current or voltage supplied to the anode electrode and the cathode electrode (terminal).

Anode current or cathode current of EL elements, arranged in matrix on a display screen, increases as EL display panel becomes larger. This enlarges a voltage drop in a wiring where the anode current or cathode current flows. The greater voltage drop causes a greater loss in electric power, and deteriorates the EL display panel due to heat. Further, display quality can be degraded because of brightness-shading or cross-talk on the EL display screen.

Japanese Patent Application Publication JP2009-109519A1 describes an EL display device having a common power supply line formed outside an array unit and an auxiliary wiring connected to this common power supply line.

Japanese Patent Application Publication JP2006-039541 describes a structure of supplying a voltage of a printed circuit board to an EL display device via wiring formed in TCP (tricyanopyrroline).

A cathode electrode formed on the display screen of the EL display panel is made of very thin magnesium (Mg)-silver (Ag) so that the cathode electrode can have light transmittance. Therefore, its sheet resistance value becomes larger. If the sheet resistance is large, a current flowing in the cathode electrode causes a large voltage drop, and brightness-shadings or cross-talk can be generated as a result. Further, a current-flow can concentrate in a connecting point where a wiring for supplying cathode voltage to the cathode electrode is connected. As a result, the connection point melts due to overheat or heat generation.

To address this problem, one proposed approach is to form a wiring portion made of low resistance metal material and connect this wiring portion to the cathode electrode. In such case, the wiring portion needs to be formed thick to keep its resistance low for solving the above problem, but if a thick wiring is formed, a size of display area occupying some part of the EL display panel become smaller and a frame of the display panel become larger. On top of that, this structure limits the potential locations for connecting a flexible substrate that supplies the cathode voltage, so that enough numbers of connecting points cannot be expected. As a result, the cathode current can be concentrated in the connecting point and connecting point, which then melt down, and reliability of the wiring can be degraded.

SUMMARY

An EL display device of the present disclosure has a EL display panel including a display area where pixels are arranged in matrix, a source signal line supplying an image signal to the pixel, a gate signal line supplying a signal for controlling selection or non-selection of luminescence of the pixel, and a wiring pattern formed in a circumferential portion of the display area for supplying voltage to the pixel. The EL display device also has a wiring substrate including a reinforcement wiring pattern which is electrically parallel to the wiring pattern and a connection terminal which electrically connects the reinforcement wiring pattern to the wiring pattern of the EL display panel. The wiring substrate is disposed in the peripheral portion of the EL display panel.

A wiring substrate of the present disclosure is connected to an EL display panel which has a display area where pixels are arranged in matrix, a source signal line supplying an image signal to the pixel, a gate signal line supplying a signal for controlling selection or non-selection of the luminescence of the pixel, and a wiring pattern formed in a circumferential portion of the display area for supplying voltage to the pixel. The wiring substrate includes a reinforcement wiring pattern which is electrically in parallel to the wiring pattern and a connection terminal which electrically connects the reinforcement wiring pattern to the wiring pattern of the EL display panel. The wiring substrate is connected to the source signal line and the gate signal line of the EL display panel and reinforcement wiring pattern is electrically connected in parallel to the wiring pattern.

The EL display device of the present disclosure allows enlarging the display area occupying some part of the EL display panel.

The wiring substrate employed in an EL display device of the present disclosure allows achieving an electric connection of high reliability.

BRIEF DESCRIPTION OF DRAWINGS

FIG. 3 is a cross sectional view illustrating an example of an EL display panel of an EL display device according to an exemplary embodiment.

FIG. 4 is a cross sectional view illustrating an example of an EL display panel of an EL display device according to an exemplary embodiment.

FIG. 7 also illustrates an enlarged schematic plan view a COF connection terminal portion.

FIG. 8 also illustrates an enlarged schematic plan view a COF connection terminal portion.

DETAILED DESCRIPTION

An embodiment of an EL display device and a wiring substrate employed therein will be described hereafter with reference to the accompanying drawings.

Figure 1:
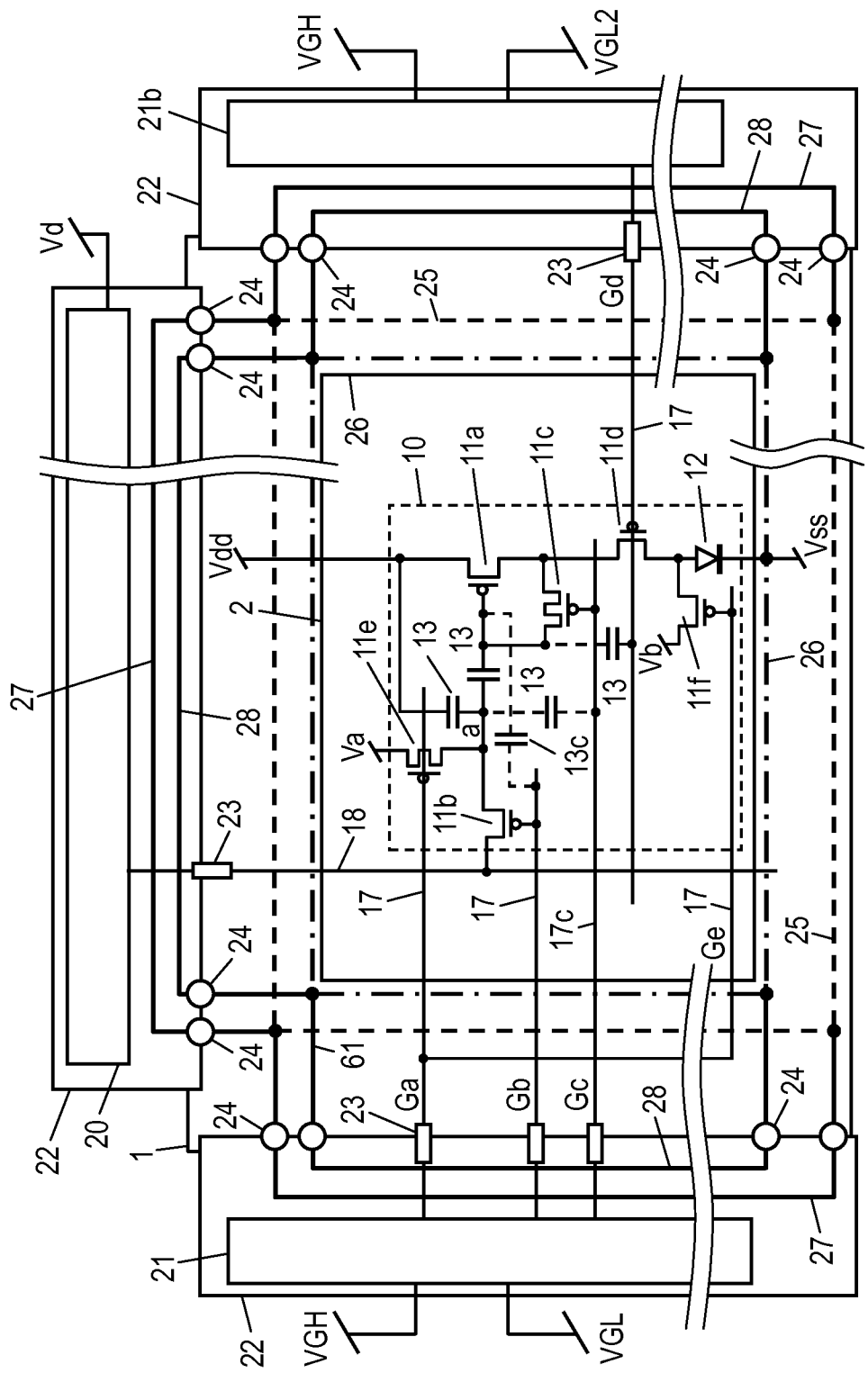
FIG. 1 illustrates a schematic structure of a pixel of an EL display device according to an exemplary embodiment.

FIG. 1 illustrates a schematic structure of a pixel of an EL display device according to one embodiment. As illustrated in FIG. 1, the EL display device is formed of EL display panel 1 and a wiring board mounted with a driving circuit. EL display panel 1 includes multiple pixels, each of which has an EL element in display area 2, are arranged in matrix.

First, the structure of a pixel is discussed. One pixel 10 has a p-channel driving transistor 11a and switching transistor 11d. A source terminal of switching transistor 11d is connected to a drain terminal of transistor 11a, and a drain terminal of transistor 11d is connected to an anode terminal of EL element 12. Transistors 11b, 11c, 11e, and 11f are switching transistors also provided in pixel 10. Capacitors 13a, 13b, 13c, 13d, and 13e are capacitors for controlling ON/OFF of transistors 11a to 11f.

Cathode voltage Vss is applied to a cathode terminal of EL element 12, and anode voltage Vdd is applied to a source terminal of transistor 11a from an anode electrode of the EL display device. Anode voltage Vdd and cathode voltage Vss are set so that they meet a relation of Vdd>Vss.

A supply of a signal controlling selection or non-selection of luminescence of pixel 10 prompts applying an ON voltage to gate signal line 17d (Gd) for turning on transistor 11d. Then a luminous current is supplied from transistor 11a to EL element 12, which then emits light in response to the amount of the luminous current. This amount is determined by applying an image signal supplied to source signal line 18 to pixel 10 via switching transistor 11b.

Specifically, source and drain terminals of transistor 11c are connected between gate and drain terminals of transistor 11a, and the gate and drain terminals of transistor 11a are short-circuited (connected) by applying ON-voltage to gate signal line 17c (Gc). A first terminal of capacitor 13b is connected to the gate terminal of transistor 11a, and a second terminal of capacitor 13b is connected to a drain terminal of transistor 11b. A source terminal of transistor 11c is connected to source signal line 18 via transistor 11b. When ON voltage of gate signal line 17c (Gc) is applied to a gate terminal of transistor 11c, which is then turned ON, voltage Vs is applied to pixel 10 in response to an image signal supplied to source signal line 18.

A first terminal of capacitor 13a of pixel 10 is connected to the drain terminal of transistor 11b. A second terminal is connected to the anode electrode of the EL display device and anode voltage Vdd is applied to this terminal.

A drain terminal of transistor 11e is connected to the drain terminal of transistor 11b. A source terminal of transistor 11e is connected to a signal line to which reset voltage Va is applied. Transistor 11e is turned on by applying ON voltage to gate signal line 17a (Ga), and reset voltage Va is thus applied to capacitor 13a.

Transistors 11c and 11e are P-channel transistors and have LDD (Lightly Doped Drain) structure. By connecting multiple transistors in series, off-characteristics of transistors 11c and 11e are improved. It is also desirable for transistors other than transistors 11c and 11e to use the P-channel and LDD structure. The transistors can be a multi-gated structure if necessary to suppress an off-leak current and achieve a satisfactory contrast and an offset cancelling performance.

Capacitor 13a can be connected to other kinds of direct-current voltage instead of applying anode voltage Vdd. Similarly, a voltage other than anode voltage Vdd can be applied to transistor 11a. In other words, instead of applying the same voltage to capacitor 13a and the source terminal of transistor 11a, different voltages can be applied. For example, anode voltage Vdd can be applied to the source terminal of transistor 11a, and direct-current voltage Vb (5 Volts) can be applied to capacitor 13a.

In digital driving methods such as PWM (Pulse Width Modulation) driving method which display images by blinking or digitally lighting pixel 10, luminescence is controlled by first applying a predetermined voltage to pixel 10 via transistor 11b, and then turning transistor 11d ON or OFF according to binary data corresponding to a level of the image signal. Further, ON/OFF state of transistor 11d is controlled to generate a belt-like black display (non-display) in display area 2, whereby an amount of current in display area 2 is controlled.

Next, function of capacitors 13c and 13d which are shown on dotted lines of FIG. 1 is discussed. Capacitor 13c is formed between gate signal line 17b and transistor 11a. Capacitor 13d is formed between gate signal line 17d and the gate terminal of transistor 11a. Capacitors 13c and 13d are called "punch-through capacitors" and the voltage which will be changed or which has been changed is called "punch-through voltage".

When ON voltage (VGL) is applied to gate signal line 17b of FIG. 1, transistor 11b is in ON state, and an image signal applied to source signal line 18 is thus supplied to pixel 10.

Next, when the voltage applied to gate signal line 17b changes from ON-voltage VGL to OFF-voltage VGH, transistor 11b is turned OFF. Simultaneously, voltage of one terminal of capacitor 13c changes from voltage VGL to VGH, and this voltage-change is transmitted to the gate terminal of transistor 11a. The transmitted voltage increases the gate terminal voltage of transistor 11a. Since transistor 11a is a P-channel transistor, the foregoing voltage-change decreases the current supplied from transistor 11a to EL element 12. As a result, a satisfactory black display state is achieved.

As discussed above, a satisfactory black display state is achieved by changing the gate terminal voltage of driving transistor 11a, i.e. voltage of capacitor 13e, with the aid of capacity of capacitor 13c.

When transistor 11d is ON, voltage VGL2 is applied to gate signal line 17d. When transistor 11d is OFF, voltage VGH2 is applied to gate signal line 17d. Transistor 11d is in OFF state during offset cancellation operation, and is in ON state when light is emitted from EL element 12. Therefore, voltage of gate signal line 17d changes from voltage VGH2 to voltage VGL2 at start of the displaying. The voltage of the gate terminal of transistor 11a decreases due to a function of the punch-through capacitor 13d. The decrease of the gate terminal voltage of transistor 11a enables transistor 11a to supply a large current to EL element 12, and high-brightness display can be thus achieved.

By changing the gate terminal voltage of transistor 11a with the aid of the capacity of capacitor 13d, amplitude of EL element can be increased and can display images of high-brightness.

Capacity of capacitor 13c is desirably between 1/12 to 1/3 (inclusive) of capacity of capacitor 13a or 13b. When the capacity ratio of capacitor 13c is too small, difference from an ideal value, i.e. the value when an offset is cancelled, becomes too small. When the capacity ratio is too large, change in the gate terminal voltage of transistor 11a becomes small and cannot obtain a sufficient effect.

The gate terminal voltage of driving transistor 11a can be changed not only by a direct-control using capacitor 13c but also by an indirect-control using another capacitor.

Next, a wiring board mounted with a driving circuit and a wiring structure will be discussed.

As illustrated in FIG. 1, the driving circuit has source driver IC 20 working as a source driver circuit, and gate driver ICs 21a and 21b working as gate driver circuits. Each of the ICs 20, 21a and 21b is mounted on flexible substrate (it is referred to as "COF 22" hereafter) working as a wiring board.

Each of COFs 22 has connection electrode 23 and connection terminal 24 for connecting with EL display panel 1. Further, COF 22 has reinforcing wiring patterns, i.e. anode reinforcing wiring 27 and cathode reinforcing wiring 28, provided thereon. Anode reinforcing wiring 27 is connected electrically in parallel to anode ring 25 at connection terminal 24. Cathode reinforcing wiring 28 is connected electrically in parallel to cathode ring 26 at connection terminal 24. The rings 25 and 26 are ring-like wire patterns formed in the circumference of display area 2 of EL display panel 1 and they are provided for applying predetermined voltages to pixels 10. First connection electrode 23 of COF 22 is connected electrically to source signal line 18 of EL display panel 1, and second connection electrode 23 of COF 22 is connected electrically to gate signal lines 17a to 17e of EL display panel 1.

In the example of FIG. 1, anode ring 25 and cathode ring 26 are formed in the circumference of display area 2, but only one of the rings can be formed. It is not necessary that these rings be formed in the entire circumference. Similarly, reinforcement wiring patterns of COF 22 can be formed on at least one of anode reinforcement wiring 27 or cathode reinforcement wiring 28.

Sheet resistance values of anode reinforcement wiring 27 and cathode reinforcement wiring 28 are set to values less than or equal to 1/1.5 compared with those of anode ring 25 and cathode ring 26. Preferably the value should be set to ½ or less. For example, when sheet resistance values of anode ring 25 and cathode ring 26 are 1.5 ohms, a film thickness and a wiring width of the wirings 27 and 28 should be adjusted so that their sheet resistance value becomes 1 ohm (=1.5/1.5) or less.

Source driver IC 20 and gate driver ICs 21a and 21b can have not only driver function but also others such as power supply circuit, buffer circuit (including circuits such as shift register), data conversion circuit, latch circuit, command decoder, shift circuit, address conversion circuit, and image memory.

According to one embodiment of EL display device, anode reinforcement wiring 27 and cathode reinforcement wiring 28 formed in COF 22 are connected electrically in parallel to anode ring 25 and cathode ring 26 formed in circumference of display area 2 of EL display panel 1. The current of the wiring patterns on circumference of display area 2 can be branched to the reinforcement wiring patterns, and can lower the sheet resistance value of the reinforcement wiring pattern of COF 22. As a result, a width of the wiring pattern on circumference of display area 2 can be narrowed, and can increase the occupying area of display area 2 in EL display panel 1. Further, wiring pattern of EL display panel 1 can be prevented from being fused due to excessive current-flow, and highly reliable electric wiring can be achieved.

Further, a voltage drop of anode voltage Vdd can be prevented, thereby obtaining large image amplitude. Thus, even when the power supply voltage of source driver IC 20 is low, large image amplitude can be obtained for the low power supply voltage. As a result, the power supply voltage can be set low and a low power consumption driver IC can be used. This reduces the cost of EL display device.

According to one embodiment, voltage of the gate terminal of driving transistor 11a can be changed by function of the punch-through capacitor. This reduces the current supplied from driving transistor 11a. As a result, an amplitude value of image signal can be lowered, and power consumption of source driver IC 20 can thereby be reduced.

The punch-through voltage for changing the gate terminal of driving transistor 11a can be controlled by changing VGH and VGL voltages of FIG. 1 or changing a difference between these voltages. One driving method is to change or control VGH and VGL voltages in response to a lighting rate. The other method is to change or control one of VGH or VGL voltages or both of them based on a level or an amplitude of the image signal applied to pixel 10. In other words, at least one of VGH or VGL voltages can be changed based on the amount of a current or a voltage-drop of anode reinforcement wiring 27 and cathode reinforcement wiring 28.

In the above, the structure having anode ring 25 to which anode voltage Vdd is applied, and cathode ring 26 to which cathode voltage Vss is applied are discussed. However, when one of anode voltage Vdd and cathode voltage Vss is set at ground potential or reference potential, the wiring pattern formed in the circumference of display area 2 can supply only one of anode voltage Vdd or cathode voltage Vss.

FIGS. 2A to 2D illustrate operations of a pixel of an EL display device according to one embodiment. The lighting operation of pixel 10 is detailed with reference to FIGS. 2A to 2D. The illustrations of operation of writing an image signal to a pixel and luminescence operation of EL element 12 proceed in the order of FIGS. 2A, 2B, 2C, and 2D.

Figure 2A:
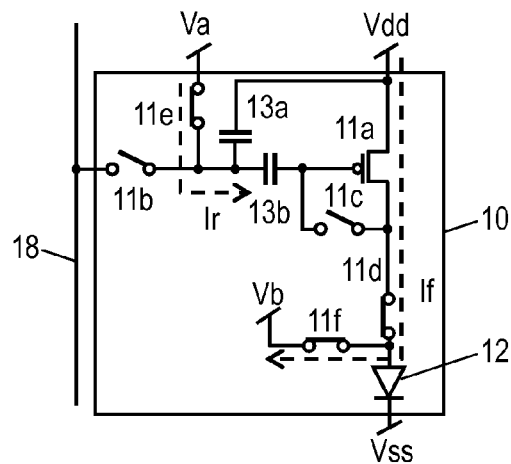
FIG. 2A illustrates an operation of a pixel of an EL display device according to an exemplary embodiment.

FIG. 2A illustrates an initial operation. The initialization operation is executed following the horizontal synchronization signal (HD). In FIG. 1, ON voltage is applied to gate signal lines 17a, 17d, and 17e, to turn transistors 11d, 11e, and 11f on. OFF voltage is applied to gate signal lines 17b and 17c, to turn transistors 11b and 11c off. Reset voltage Va is applied to one terminal of capacitor 13a from a signal line to which reset voltage Va is applied.

Offset-cancellation current (If) flows into transistor 11a, where the current (If) flows from source-terminal potential Vdd to direct-current voltage Vb via channels of transistors 11a, 11c, and 11f, and the voltage Vb is the voltage applied to a drain-terminal electrode of transistor 11f. The above voltages satisfy the following relations: anode voltage Vdd>direct-current voltage Vb, and reset voltage Va>direct-current voltage Vb.

The drain-terminal voltage of transistor 11a falls by offset-cancellation current (If). Reset voltage Va is applied to a terminal of capacitor 13b when reset current Ir flows due to voltage Va.

The transistor 11a is turned on and offset-cancellation current (If) flows for a short period. Transistor 11a turns operable by this offset-cancellation current (If) because a drain-terminal voltage of transistor 11a decreases at least below anode voltage Vdd.

Figure 2B:
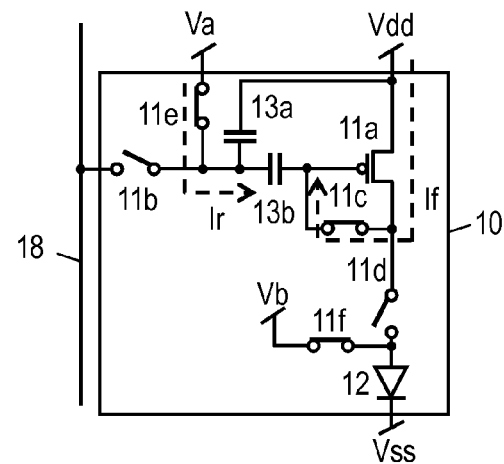
FIG. 2B illustrates an operation of a pixel of an EL display device according to an exemplary embodiment.

FIG. 2B illustrates a reset operation. ON voltage is applied to gate signal line 17c of FIG. 1, and OFF voltage is applied to gate signal line 17d. Transistor 11d thus turns off and transistor 11c turns on.

By turning transistor OFF, and turning transistor 11c ON, offset-cancellation current (If) can flow toward the gate terminal of transistor 11a. Offset-cancellation current (If) is comparatively large at beginning. This current decreases as the gate-terminal potential of transistor 11a increases and approach the OFF state. Finally, the current value reaches to 0 (A) or to a value near 0 (A).

As a result of above operation, transistor 11a is turned to an offset-cancellation state. Offset-cancellation voltage is stored in capacitor 13b. In capacitor 13b, one terminal is maintained at reset voltage Va and the other terminal, i.e. the terminal connected to a gate terminal of transistor 11a, is maintained at the offset-cancellation voltage.

Figure 2C:
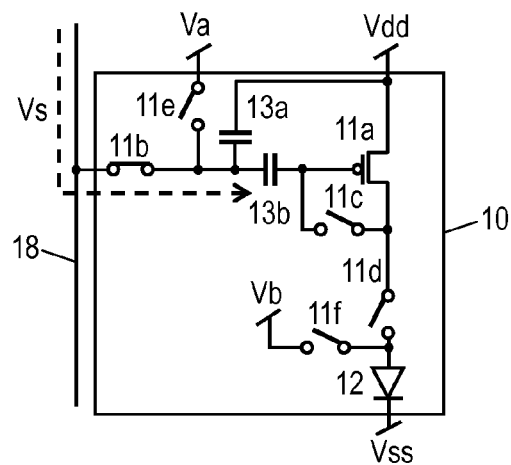
FIG. 2C illustrates an operation of a pixel of an EL display device according to an exemplary embodiment.

FIG. 2C illustrates a program operation. In the program operation, OFF voltage is applied to gate signal lines 17a, 17c, and 17d of FIG. 1 to turn off transistors 11e, 11c, and 11d. ON voltage is applied to gate signal line 17b to turn on transistor 11b.

On the other hand, image signal voltage Vs is applied to source signal line 18. Image signal voltage Vs is then applied to capacitor 13b when transistor lib is turned on. One terminal of capacitor 13b changes its potential from reset voltage Va to image signal voltage Vs. As a result, a voltage based on sum of image signal voltage Vs and the offset-cancellation voltage is stored in capacitor 13b.

Image signal voltage Vs is the voltage based on anode voltage Vdd. Anode voltages Vdd are different in the panel due to a voltage drop of wiring inside the panel. Thus, image signal voltage Vs is changed or controlled based on anode voltage Vdd applied to a pixel.

Figure 2D:
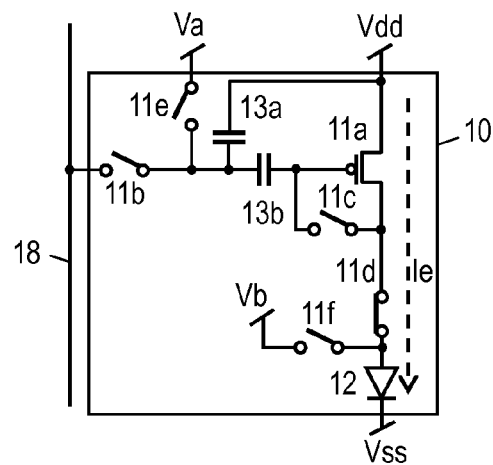
FIG. 2D illustrates an operation of a pixel of an EL display device according to an exemplary embodiment.

FIG. 2D illustrates a luminescence operation of EL element 12. Subsequent to the program operation of FIG. 2C, OFF voltage is applied to gate signal line 17b of FIG. 1, and transistor 11b turns to OFF state. Pixel 10 is thus separated from source signal line 18. ON voltage is applied to gate signal line 17d, and transistor 11d is turned on. Luminous current Ie from transistor 11a is then supplied to EL element 12. EL element 12 emits light based on the supplied luminous current Ie.

In FIGS. 1 and 2A to 2D, transistor 11f can be omitted. In this case, when transistor 11d in FIG. 2A is turned ON, offset-cancellation current (If) can flow into EL element 12. Although EL element 12 emits light in response to the current (If), EL element 12 emits light for very short time because the current (If) flow for a period of only 1 s or less. Thus, decrease in contrast of EL display (EL display panel) is very small in this embodiment.

Source driver IC 20, working as a source driver circuit, can have not only a driver function but also other circuits, such as power supply circuit, buffer circuit (including shift register), data conversion circuit, latch circuit, command decoder, shift circuit, address conversion circuit, and image memory.

FIG. 3 is a cross sectional view illustrating an example of EL display panel of one embodiment. As shown in FIG. 3, seal board 30 is disposed at the back side of EL display panel, array substrate 31 is disposed at the display surface side, and polarizing plate 32 is disposed on the display surface of array substrate 31. Array substrate 31 is made of material having light transmittance such as glass, silicon wafer, metal substrate, ceramic substrate, plastic sheet etc. Array substrate 31 can be also made of sapphire glass to improve heat dissipation characteristics. Seal board 30 is made of a material same as that of array substrate 31. A desiccant (not illustrated) is disposed in a space between seal board 30 and array substrate 31 to prevent degradation of EL material which is not tolerant to humidity. The peripherals of seal board 30 and array substrate 31 are sealed with seal resin (not illustrated).

A temperature sensor (not illustrated) is disposed in the space between seal board 30 and array substrate 31, or on the surface of seal board 30. Duty ratio or lighting rate of the EL display panel are controlled by the output result of the temperature sensor. Further, at the time of panel inspection, the operating speed of the gate driving circuit is adjusted based on the detected output of the temperature sensor.

First, the structure of TFT (Thin Film Transistor) array substrate side will be described. Referring to FIG. 3, color filter 33 (33R, 33G, 33B) of red (R), green (G), and blue (B) are formed inside array substrate 31. The color filter can have colors other than RGB, for example, pixels of cyan (C), magenta (M), or yellow (Y) can be formed. Further, white (W) can be used. One pixel for color-display is made so that a unit of three pixels of RGB forms a square shape. Aperture ratios of pixels of RGB can have different values. Current densities of EL elements 12 of RGB in each of the pixels can be set differently by setting aperture ratios different. This preparation allows EL elements 12 of R, G, B to deteriorate at the same speed.

Besides using color filter 33 discussed above, the color-display of EL display panel 1 can be also performed by forming EL layer of blue luminescence and then converting the emitted blue-color light to RGB lights using color conversion layers of RGB.

Each of the pixels formed on array substrate 31 has multiple transistors 11 as illustrated in FIG. 1. Between each of the pixels, gate signal lines 17 are disposed. Insulation film 34 working as an interlayer insulation film is formed on color filter 33 covering transistor 11, gate signal line 17, and a source signal line (not illustrated). Black matrix 35 is formed between color filters 33, and shading film 36 is formed on the portion where transistor 11 is formed. In insulation film 34, connection portion 37 is disposed for connecting transistor 11 of the array substrate 31 side to an image electrode of the luminescence unit side. Light scattering layer 38 is formed on insulation film 34. Light scattering layer 38 can be made of a resin material diffused with titanium oxide, aluminum oxide, or magnesium oxide, or of optical diffusion materials such as opal glass. Light scattering layer 38 causes an increment in the amount of the light emitted from the panel.

Next, the structure of luminescence unit side will be described. Referring to FIG. 3, ribs 39 are formed on insulation film 34 so as to divide the pixels individually. Anode electrode 40 made of transparent electrodes, such as ITO, IGZO, and IZO, and EL layers 41R, 41G, and 41B of red (R) green (G) blue (B) are formed inside the rib 39. Cathode electrode 42 is formed on EL layers 41R, 41G, and 41B, so that these EL layers are surrounded by anode electrode 40 and cathode electrode 42.

Cathode electrode 42 can be made of silver (Ag), aluminum (AL), magnesium (Mg), calcium (Ca) or alloys thereof. Cathode electrode 42 can be made also of transparent electrodes, such as ITO, IGZO and IZO.

The example of FIG. 3 relates to a structure where the light is emitted from the array substrate 31 side. Instead, an EL display panel having a structure where light is emitted from the luminescence unit side can be employed.

In the panel illustrated in FIG. 4, low resistance wiring 43 is formed in the upper layer or lower layer of cathode electrodes 42. The wiring 43 is made of layered structure of metal selected from chromium (Cr), aluminum (Al), titanium (Ti), or copper (Cu), or of an alloy metal thin film made of multiple metal materials. Seal film 44 covers cathode electrodes 42 so as to cover the wiring 43. Seal substrate 45 made of a glass substrate or light transmittance film is then adhered to seal film 44 using adhesive layer 46.

Figure 5:
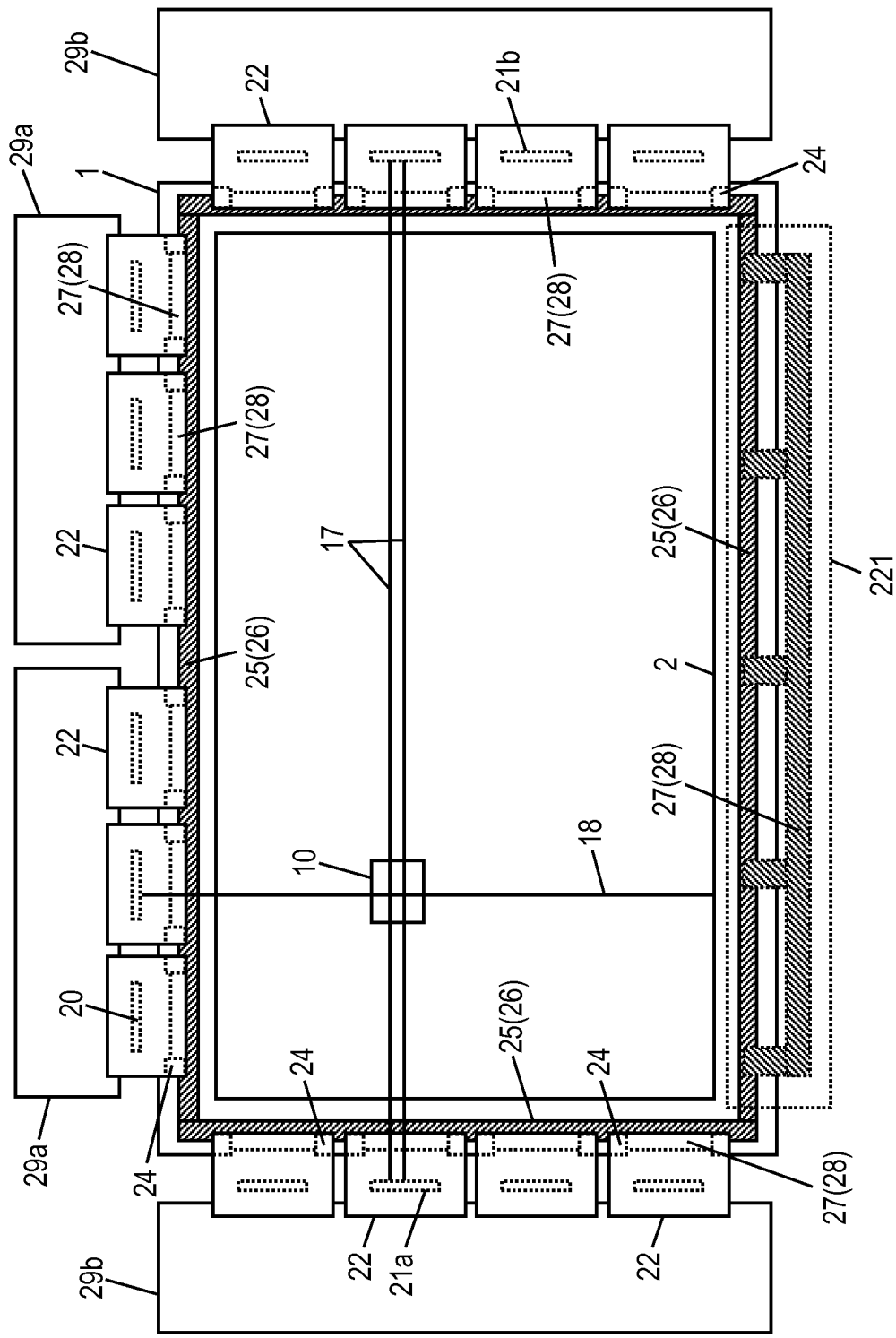
FIG. 5 is a plan view illustrating a wiring structure of an EL display device according to another embodiment.

FIG. 5 is a plan view illustrating a wiring structure of EL display device according to another embodiment. The similar elements to those in FIG. 1 have the same reference marks.

As illustrated in FIG. 5, multiple COFs 22 are disposed such that they are electrically connected together in the peripherals of three sides of EL display panel 1. Source driver IC 20, which is connected to the source signal line 18, is mounted on COF 22 of the source driver circuit side. Gate driver IC 21a, 21b, which are connected to gate signal lines 17a to 17e (they are collectively called "gate signal line 17" hereafter), are mounted on COF 22 of the gate driver circuit side. Further, COF 22 of the source driver circuit side is connected to printed circuit board 29a where a driving circuit for controlling source driver IC 20 is mounted. COF 22 of the gate driver circuit side is connected to printed circuit board 29b where a driving circuit for controlling gate driver ICs 21a and 21b is mounted. An anisotropically conductive adhesive material is used for electrical connection of COF 22.

COF 221, which is a wiring circuit employing only anode reinforcement wiring 27 and cathode reinforcement wiring 28, is arranged on a peripheral portion of one side of EL display panel 1. The reinforcement wiring patterns of COF 221 are connected electrically parallel to anode ring 25 and cathode ring 26, each of which is a wiring pattern for supplying voltage to pixel 10, through a connection terminal.

Source driver IC 20 outputs an image signal to source signal line 18, and supplies the signal to each of the pixels. Gate driver ICs 21a and 21b output selection/non-selection voltage, i.e. ON/OFF voltage to gate signal line 17, and applies the voltage to each of the pixels.

Figure 6:
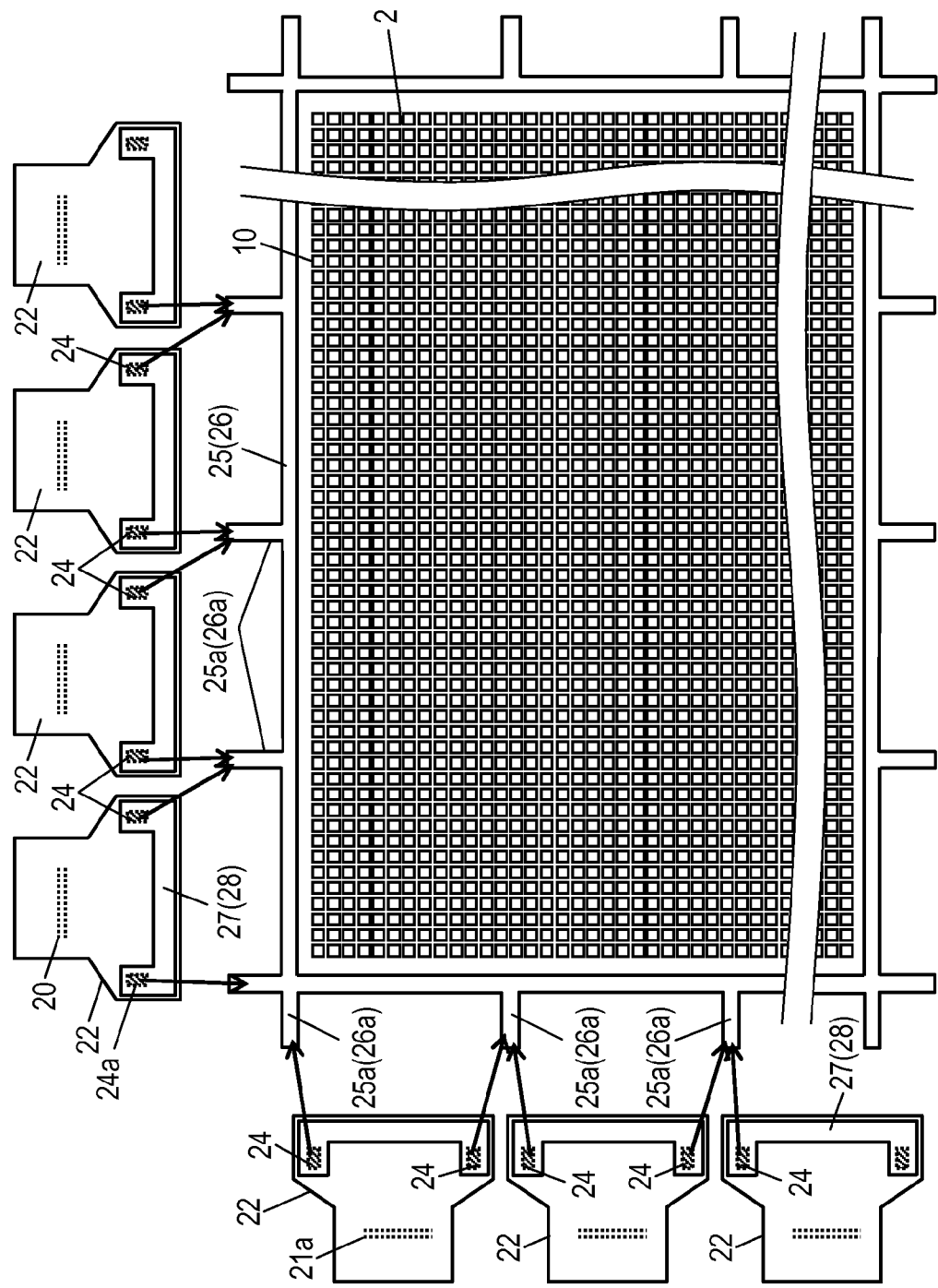
FIG. 6 is a plan view illustrating a portion of a connection structure of COF (Chip On Flexible) and EL display panel of the EL display device of FIG. 5.

FIG. 6 is a plan view illustrating a portion of a connection structure of COF and EL display panel of the EL display device of FIG. 5. As illustrated in FIG. 6, COF connection terminals 25a and 26a are formed in anode ring 25 and cathode ring 26, at a place where connection terminals of COF 22 is electrically connected. COF connection terminals 25a, 26a and connection terminal 24 of COF 22 are connected together electrically and mechanically via anisotropically conductive adhesive.

Figure 7:
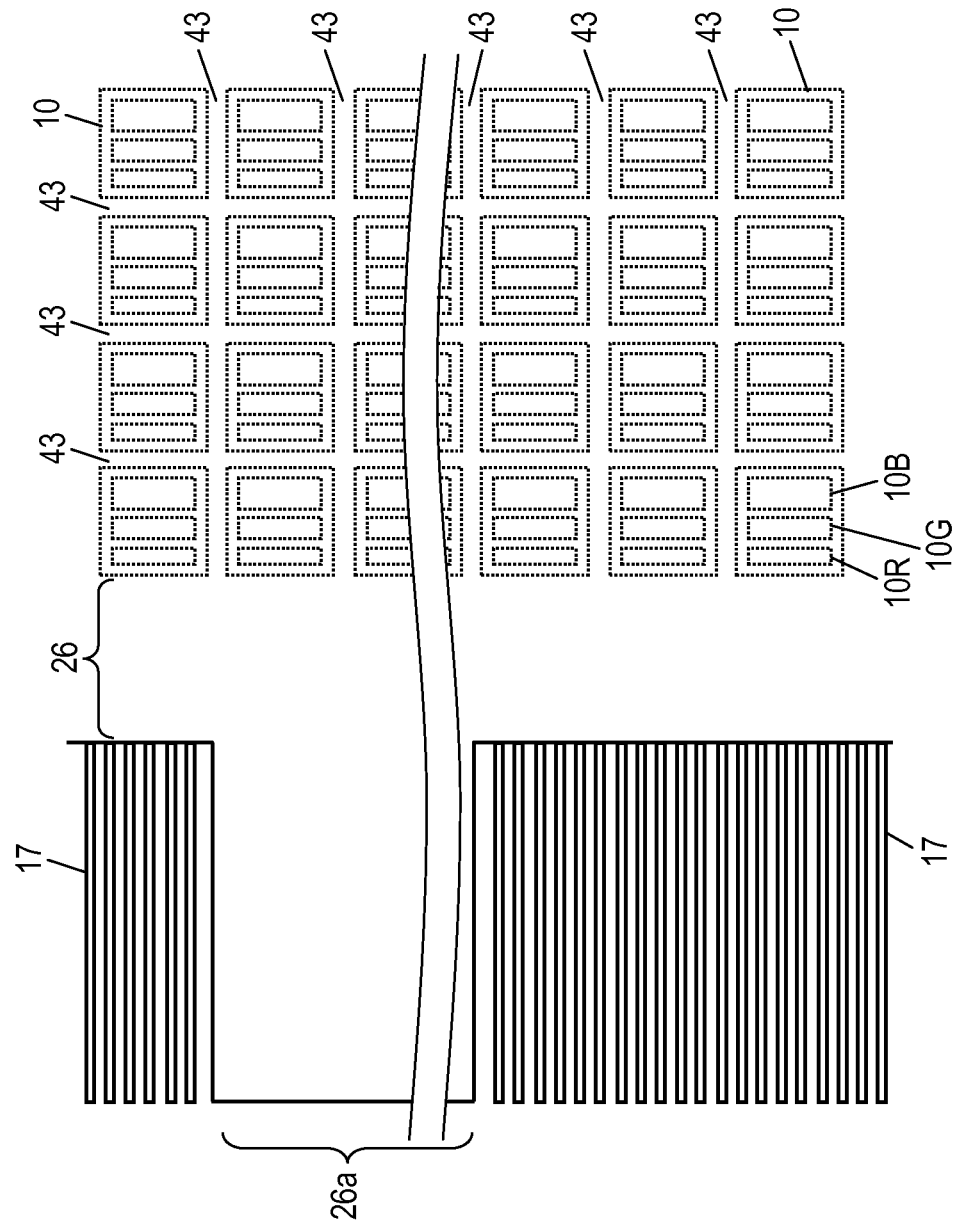
FIG. 7 is an enlarged schematic plan view illustrating a connection structure of a cathode electrode and a cathode ring in the EL display panel of the EL display according to an exemplary embodiment.

FIG. 7 is an enlarged schematic plan view illustrating a connection structure of a cathode electrode and a cathode ring. FIG. 7 also illustrates a COF connection terminal portion.

As illustrated in FIG. 7, cathode ring 26 is formed in the peripheral portion of display area 2, and COF connection terminal 26a is formed on cathode ring 26. Although not illustrated, gate signal line 17 and cathode ring 26 are isolated by insulation film 34. Connection portion 37 of COF 22 is connected electrically and mechanically to COF connection terminal 26a.

Figure 8:
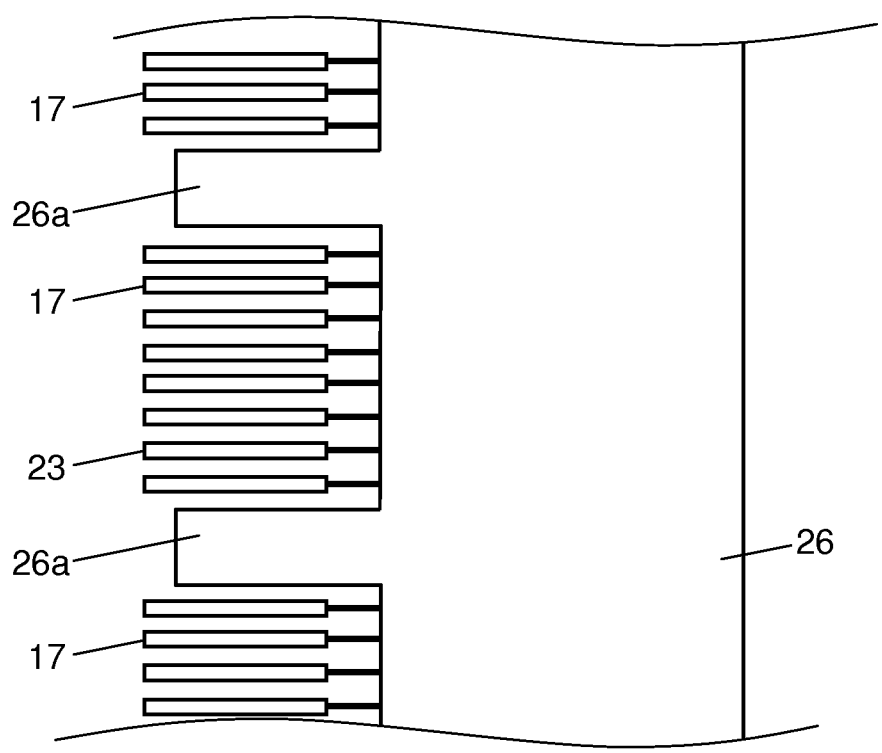
FIG. 8 is an enlarged schematic plan view illustrating a connection structure of a cathode electrode and a cathode ring in the EL display panel of the EL display according to an exemplary embodiment.

Instead of COF connection terminal 26a having a greater width as illustrated in FIG. 7, the terminals 26a divided into multiple terminals having a smaller width can be provided as illustrated in FIG. 8.

Figure 9:
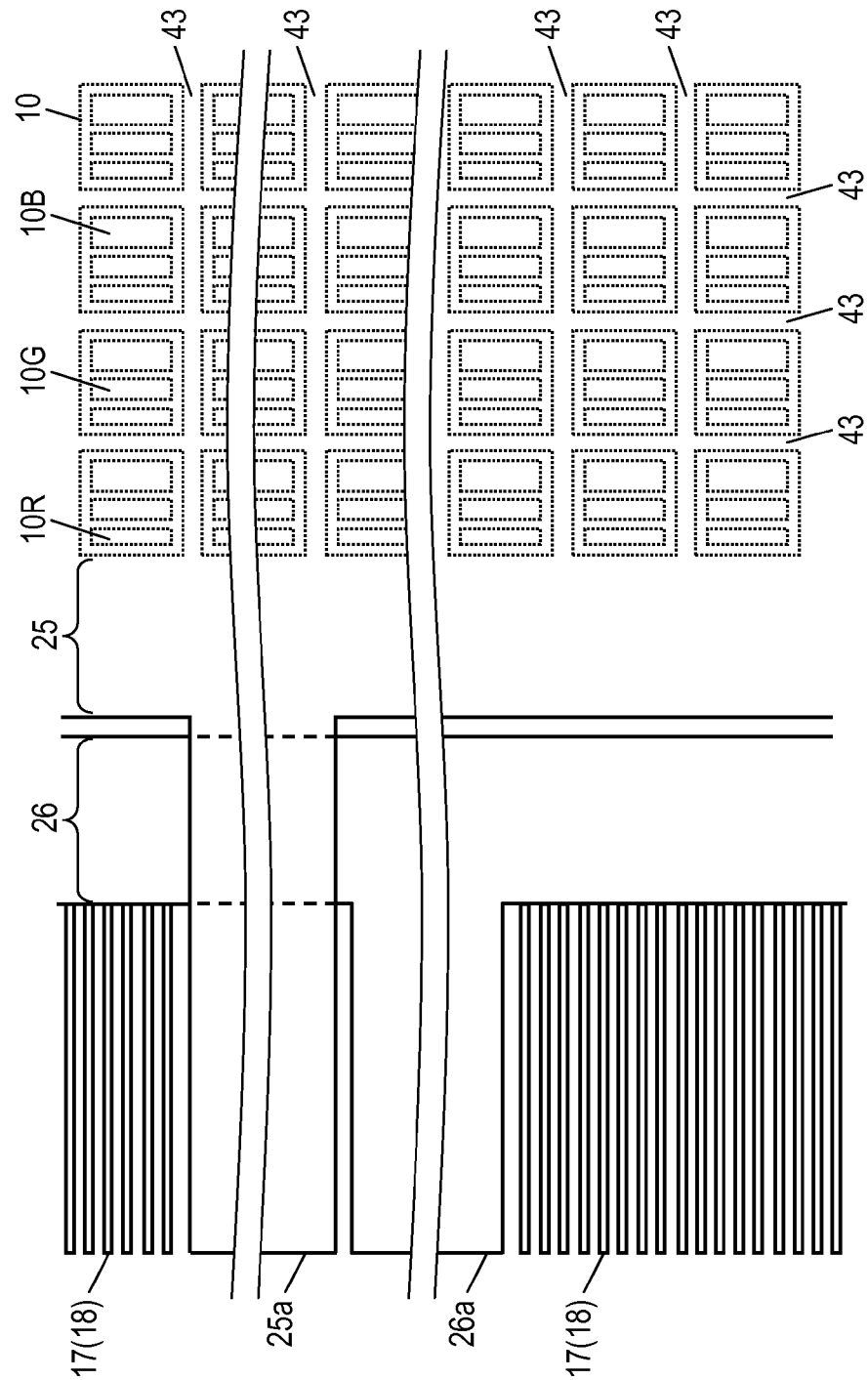
FIG. 9 is a schematic plan view illustrating an example of forming both an anode ring and a cathode ring.

FIG. 9 is a schematic plan view illustrating an example of forming both anode ring and cathode ring. In the circumference of display area 2, anode ring 25 to which anode voltage Vdd is applied and cathode ring 26 are formed.

As discussed above, COF connection terminals 25a and 26a are formed on anode ring 25 and cathode ring 26, and are connected to connection terminal 24 of COF 22 via anisotropically conductive adhesive material.

Figure 10:
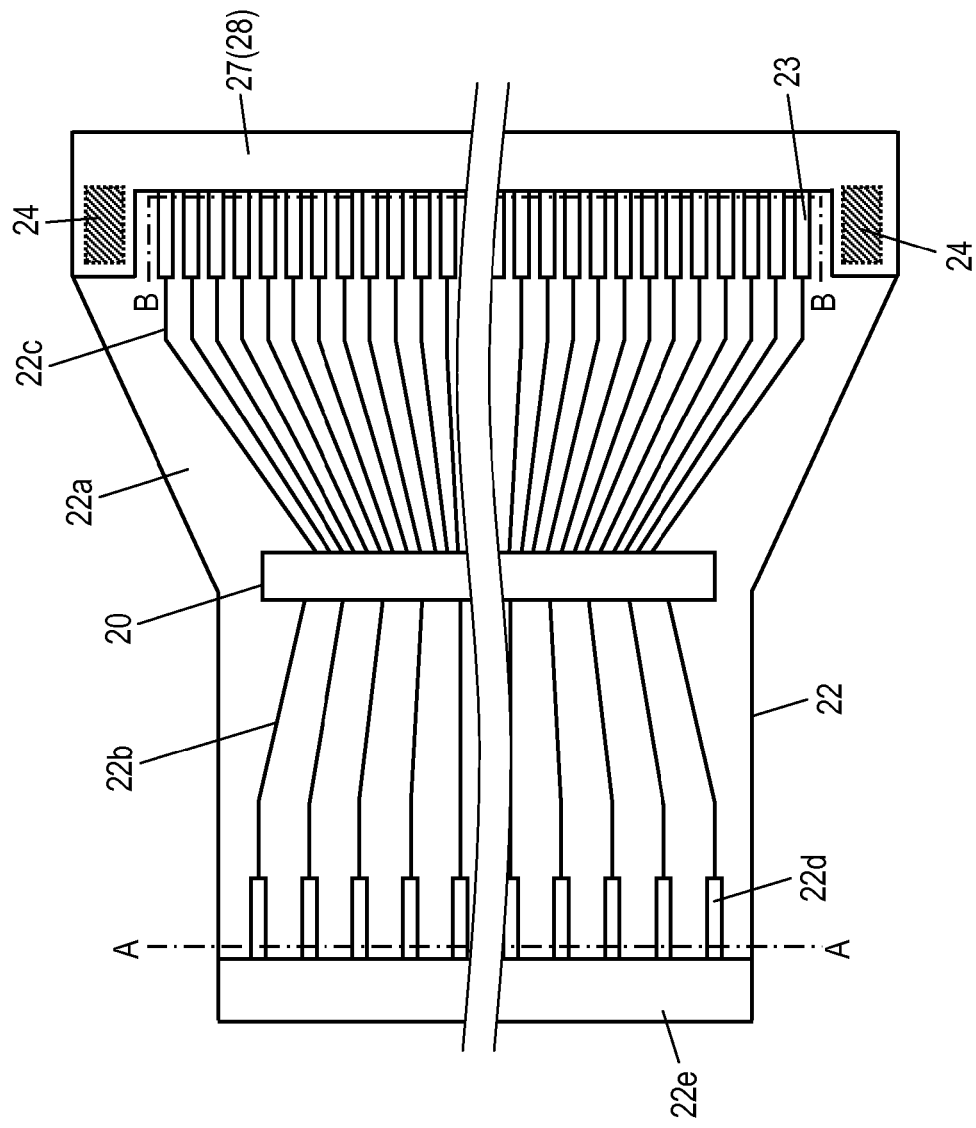
FIG. 10 is a plan view illustrating an example of COF used in an exemplary embodiment.

FIG. 10 is a plan view illustrating an example of COF used in one embodiment. FIG. 10 illustrates an example of COF 22 in the source driver circuit side. COF 22 in the gate driver circuit side has a similar structure.

As illustrated in FIG. 10, source driver IC 20 is mounted on COF 22. The input side of source driver IC 20 is connected to the input terminals 22d via input signal wirings 22b of COF 22. The output side of source driver IC is connected to connection electrodes 23 via output signal wirings 22c of COF 22.

COF 22 is formed by, in the first place, forming a conductive pattern made of copper foil between insulation film 22a having heat resistance and insulation property such as polyimide film, and then forming a coating layer made of gold or tin on the conductive pattern. Input signal wiring 22b and output signal wiring 22c of the COF are thereby formed. On the input terminal 22d side, short wiring pattern 22e is formed simultaneously with input terminal 22d and then is cut along A-A line in FIG. 10. Connection electrode 23 side is also formed by similar method.

Connection terminal 24, anode reinforcement wiring 27, and cathode reinforcement wiring 28 on the output side are formed of copper layer. A groove is formed between connection electrode 23, anode reinforcement wiring 27, and cathode reinforcement wiring 28, along the B-B line of FIG. 10 by punching operation to prevent the contact between connection electrode 23, anode reinforcement wiring 27, and cathode reinforcement wiring 28.

Figure 11:
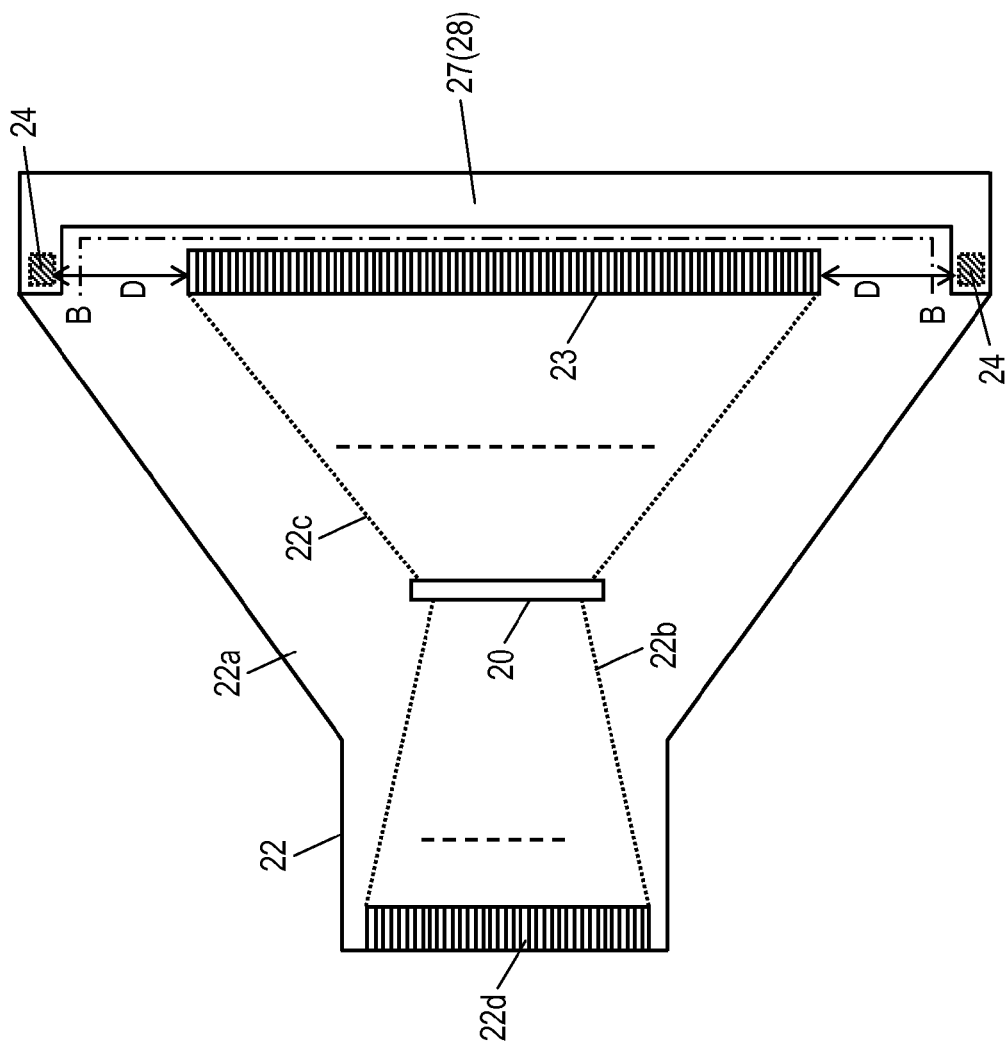
FIG. 11 is a plan view illustrating another example of COF used in an exemplary embodiment.

FIG. 11 is a plan view illustrating another example of COF used in one embodiment. In the example of FIG. 11, interval D between connection electrode 23 and connection terminal 24 is widened.

Anode reinforcement wiring 27 and cathode reinforcement wiring 28 provided in COF 22 are disposed for reducing resistances of anode ring 25 and cathode ring 26. Anode reinforcement wiring 27 and cathode reinforcement wiring 28 are desirably disposed without discontinuity to anode ring 25 and cathode ring 26. The structure shown in FIG. 11 allows connection intervals between anode ring 25 and cathode ring 26 in COFs 22 to be smaller. Anode reinforcement wiring 27 and cathode reinforcement wiring 28 can be thus disposed without discontinuity to anode ring 25 and cathode ring 26.

Figure 12:
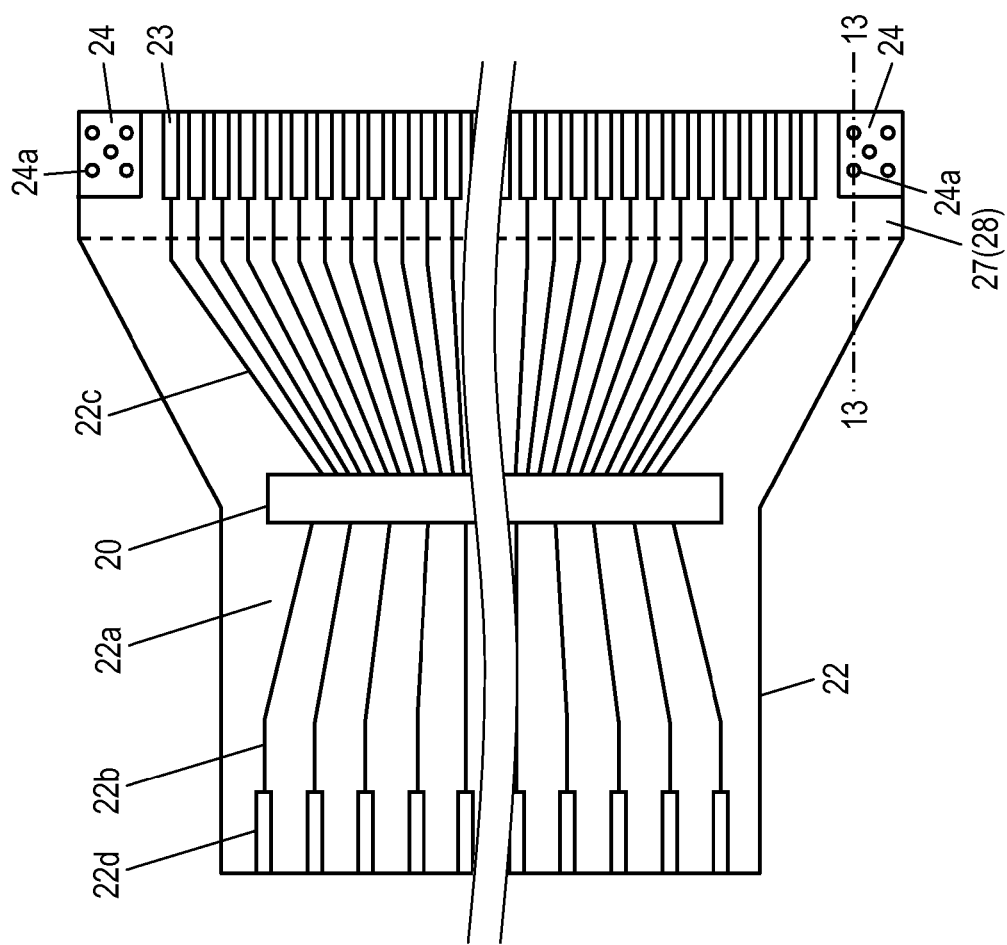
FIG. 12 is a plan view illustrating another example of COF used in an exemplary embodiment.
Figure 13:
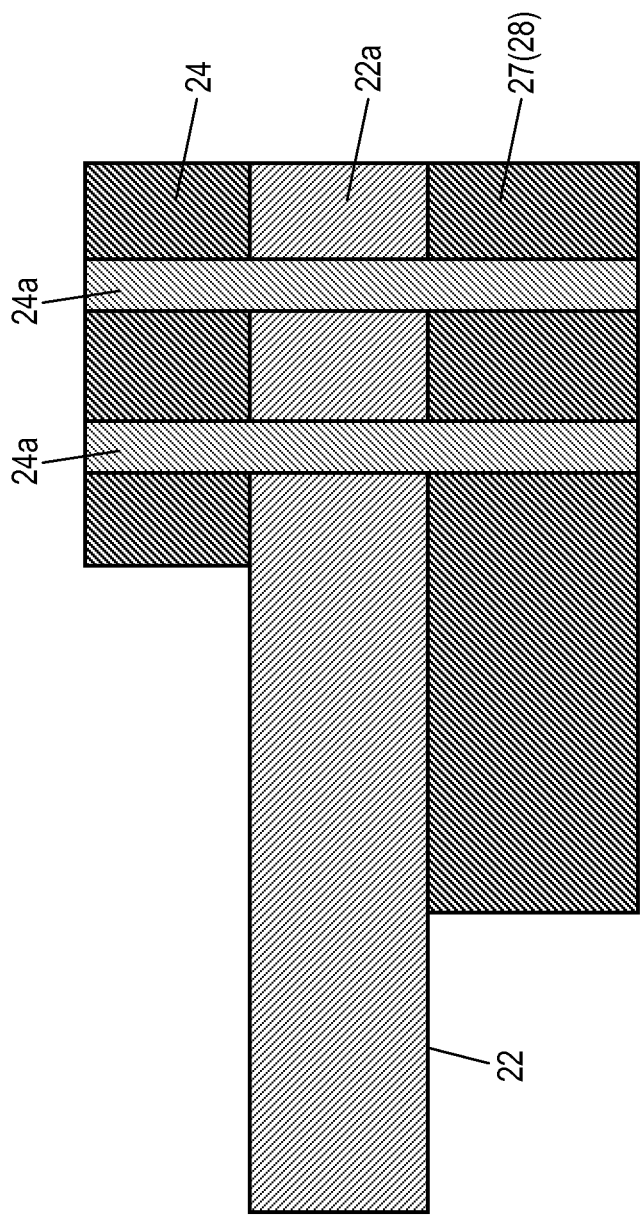
FIG. 13 is a cross sectional view cut along line 13-13 in FIG. 12.

FIG. 12 is a plan view illustrating another example of COF used in one embodiment. FIG. 13 is a cross sectional view cut along line 13-13 in FIG. 12. In the example of FIGS. 12 and 13, connection terminal 24 alone is formed on connection electrode 23 side, and anode reinforcement wiring 27 and cathode reinforcement wiring 28 are formed on the side opposite to connection terminal 24. Connection terminal 24 and anode reinforcement wiring 27 or cathode reinforcement wiring 28 are connected electrically via through hole 24a.

In the example of FIGS. 12 and 13, anode reinforcement wiring 27 and cathode reinforcement wiring 28 are formed only on the side opposite to the connection terminal 24. Instead, anode reinforcement wiring 27 and cathode reinforcement wiring 28 can be formed in both sides and can be connected using through hole 24a provided in connection terminal 24.

Figure 14:
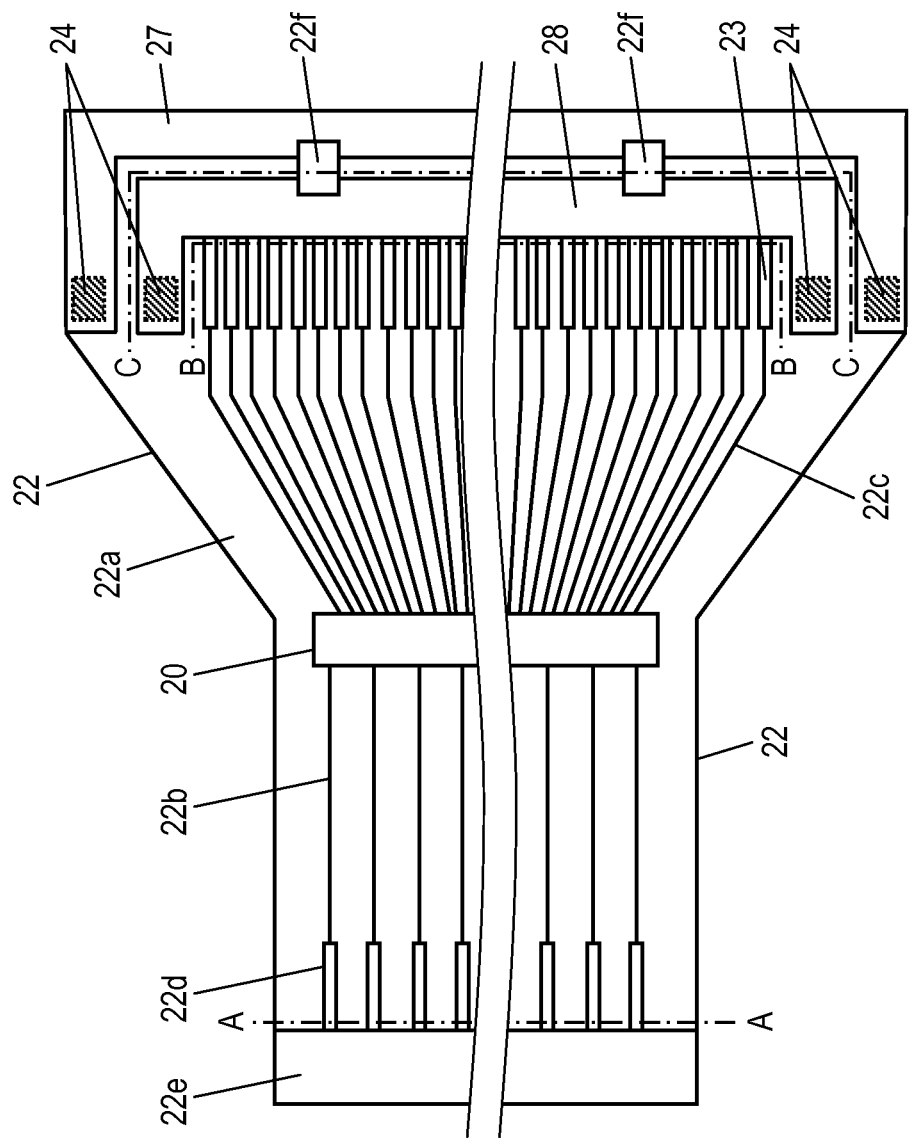
FIG. 14 is a plan view illustrating another example of COF used in an exemplary embodiment.

FIG. 14 is a plan view illustrating another example of COF used in one embodiment. The example of forming one of anode reinforcement wiring 27 or cathode reinforcement wiring 28 on COF 22 is discussed previously. Instead, both anode reinforcement wiring 27 and cathode reinforcement wiring 28 can be formed on COF 22 as illustrated in FIG. 14.

In the example of FIG. 14, anode reinforcement wiring 27 and cathode reinforcement wiring 28 are formed so that they are electrically connected together by short circuit portion 22f during the formation of COF 22. To prevent connection electrode 23 and cathode reinforcement wiring 28 from contacting each other, as discussed with reference to FIG. 10, a first groove is formed along B-B line of FIG. 14 by punching operation, and a second groove is formed along C-C line of FIG. 14. Then COF 22 is formed by eliminating short circuit portion 22f.

Figure 15:
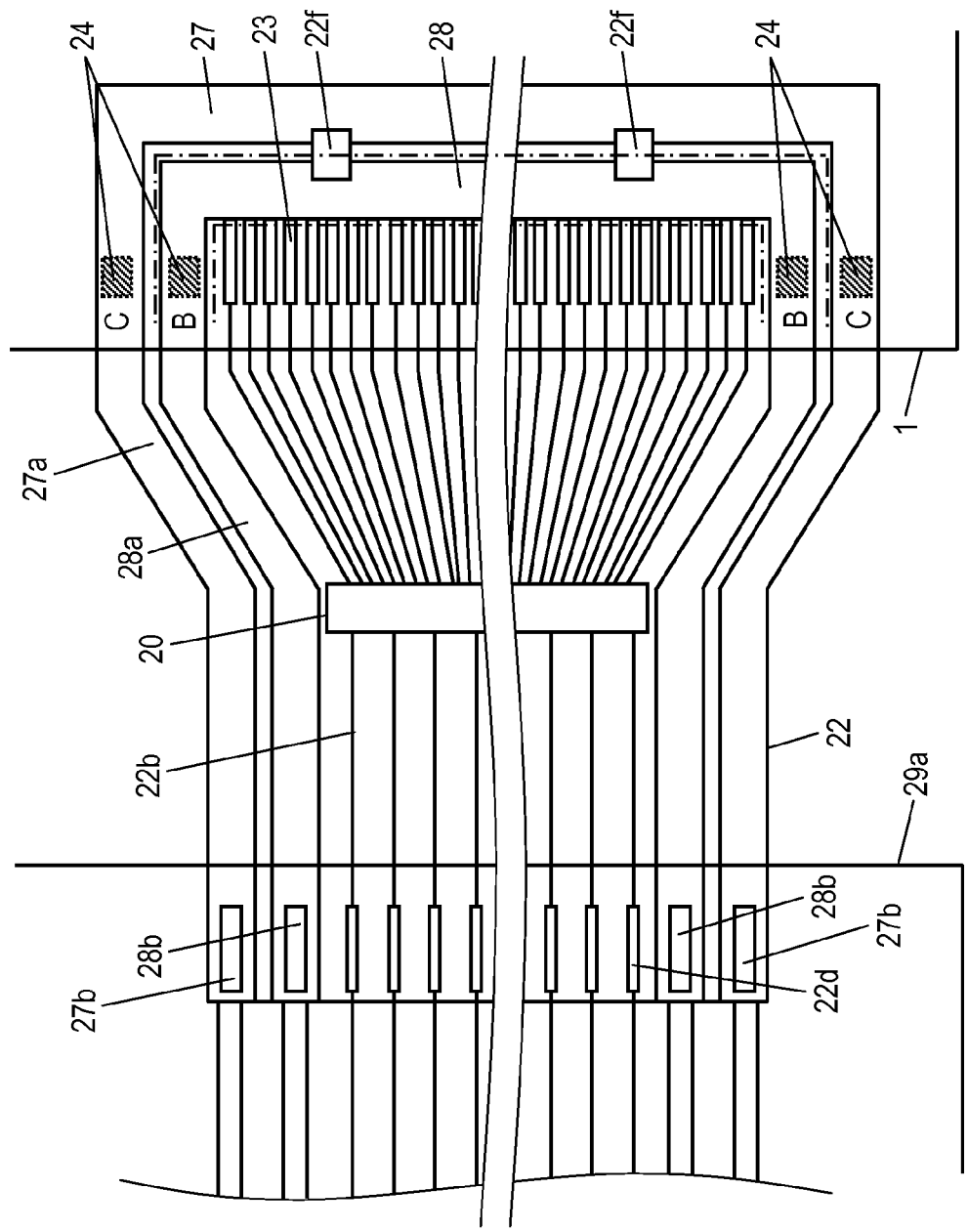
FIG. 15 is a plan view illustrating another example of COF used in an exemplary embodiment.

FIG. 15 is a plan view illustrating another example of COF used in one embodiment. In this example, extended wiring portions 27a and 28a are further provided on anode reinforcement wiring 27 and cathode reinforcement wiring 28 of COF 22 of FIG. 14 so that they extend toward the input side of COF 22 from connection terminal 24. Connecting portions 27b and 28b are also provided in parallel to input terminal 22d of COF 22 for connection to printed circuit board 29a (29b).

According to the example of FIG. 15, anode voltage Vdd and cathode voltage Vss can be supplied from power supply wiring of printed circuit board 29a (29b) via extended wiring portions 27a and 28a of anode reinforcement wiring 27 and cathode reinforcement wiring 28.

Figure 16:
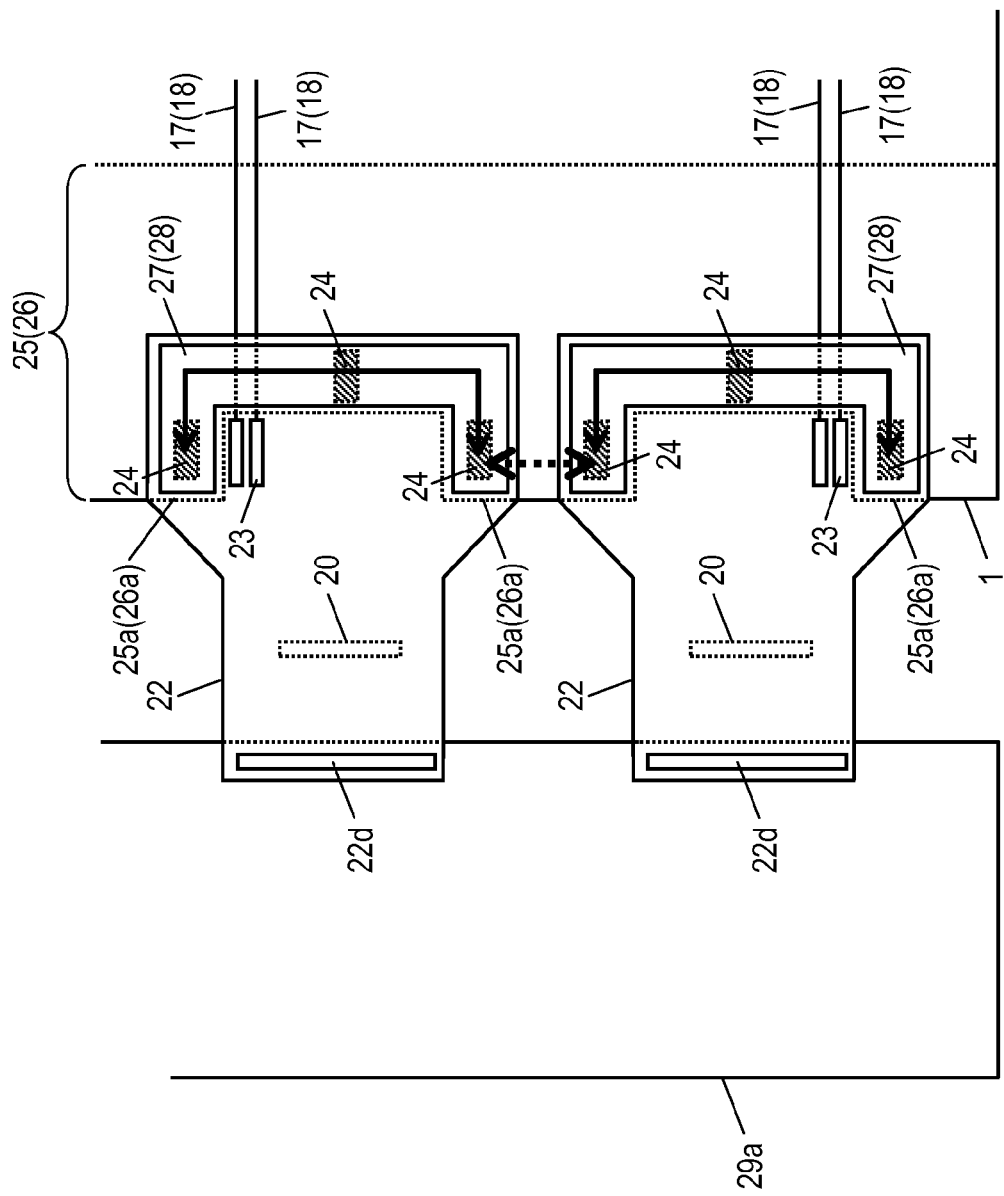
FIG. 16 is an enlarged schematic plan view of COF of FIG. 10 for illustrating a connection portion of an EL display panel and a print circuit board.

FIG. 16 is an enlarged schematic plan view of COF of FIG. 10 for illustrating the connection portion of EL display panel and print circuit board.

As illustrated in FIG. 16, anode ring 25 and cathode ring 26 are formed in the peripheral of display area 2 of EL display panel 1. COF connection terminal 25a is formed on anode ring 25, and COF connection terminal 26a is formed on cathode ring 26. Connection terminal 24 of COF 22 is connected electrically and mechanically to COF connection terminals 25a and 26a via anisotropically conductive adhesive material. Anode reinforcement wiring 27 and cathode reinforcement wiring 28 formed on COF 22 are connected to anode ring 25 and cathode ring 26 electrically parallel. The arrow of FIG. 16 shows the path of the current.

As described above, although anode ring 25 and cathode ring 26 have high resistance because they are formed by vapor deposition method, resistances of anode reinforcement wiring 27 and cathode reinforcement wiring 28 can be lowered by patterning a copper layer having sufficient thickness. Therefore, by connecting anode reinforcement wiring 27 and cathode reinforcement wiring 28 electrically parallel to anode ring 25 and cathode ring 26, the wiring resistance can be lowered as an equivalent circuit.

In the example of FIG. 16, connection terminal 24 is formed only on the both ends of anode reinforcement wiring 27 and cathode reinforcement wiring 28, but connection terminal 24 can be formed also in the intermediate portions, besides both the ends, of the wirings 27 and 28 to connect electrically to anode ring 25 and cathode ring 26.

As discussed in the example of FIG. 10, a groove is formed by punching operation between connection electrode 23 forming portion and anode reinforcement wiring 27 and cathode reinforcement wiring 28 forming portion in COF 22. The groove electrically separates these portions. Connection electrode 23 and connection terminal 24 can be arranged in straight line, and this enables the electrodes 23 and the terminal 24 to be connected to EL display panel 1 with a single operation. The groove provided in COF 22 desirably has a width of 0.2 mm or more.

Figure 17:
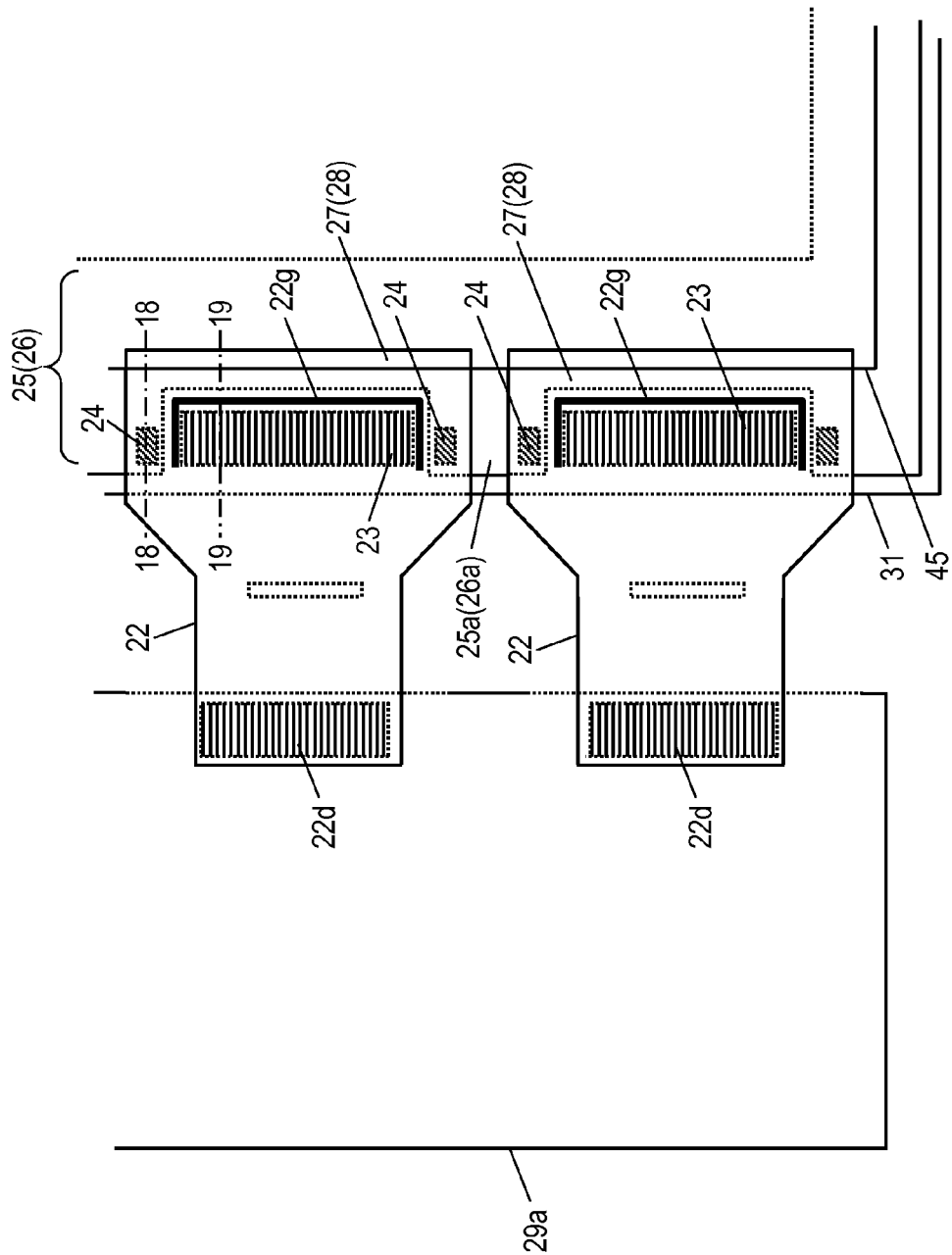
FIG. 17 is a plan view illustrating an example of connection structure of COF of EL display panel of FIG. 4.
Figure 18:
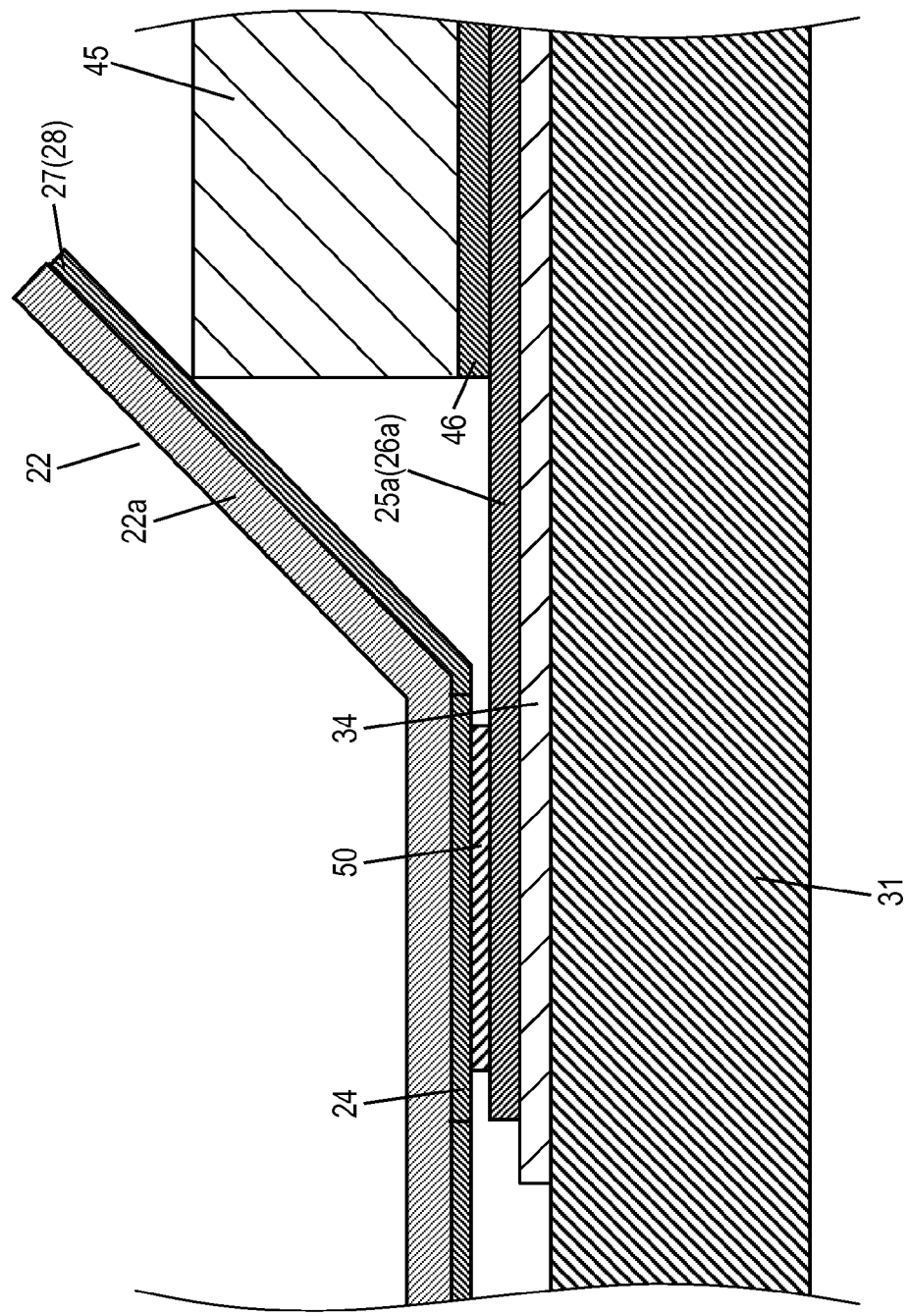
FIG. 18 is a cross sectional view cut along line 18-18 in FIG. 17.
Figure 19:
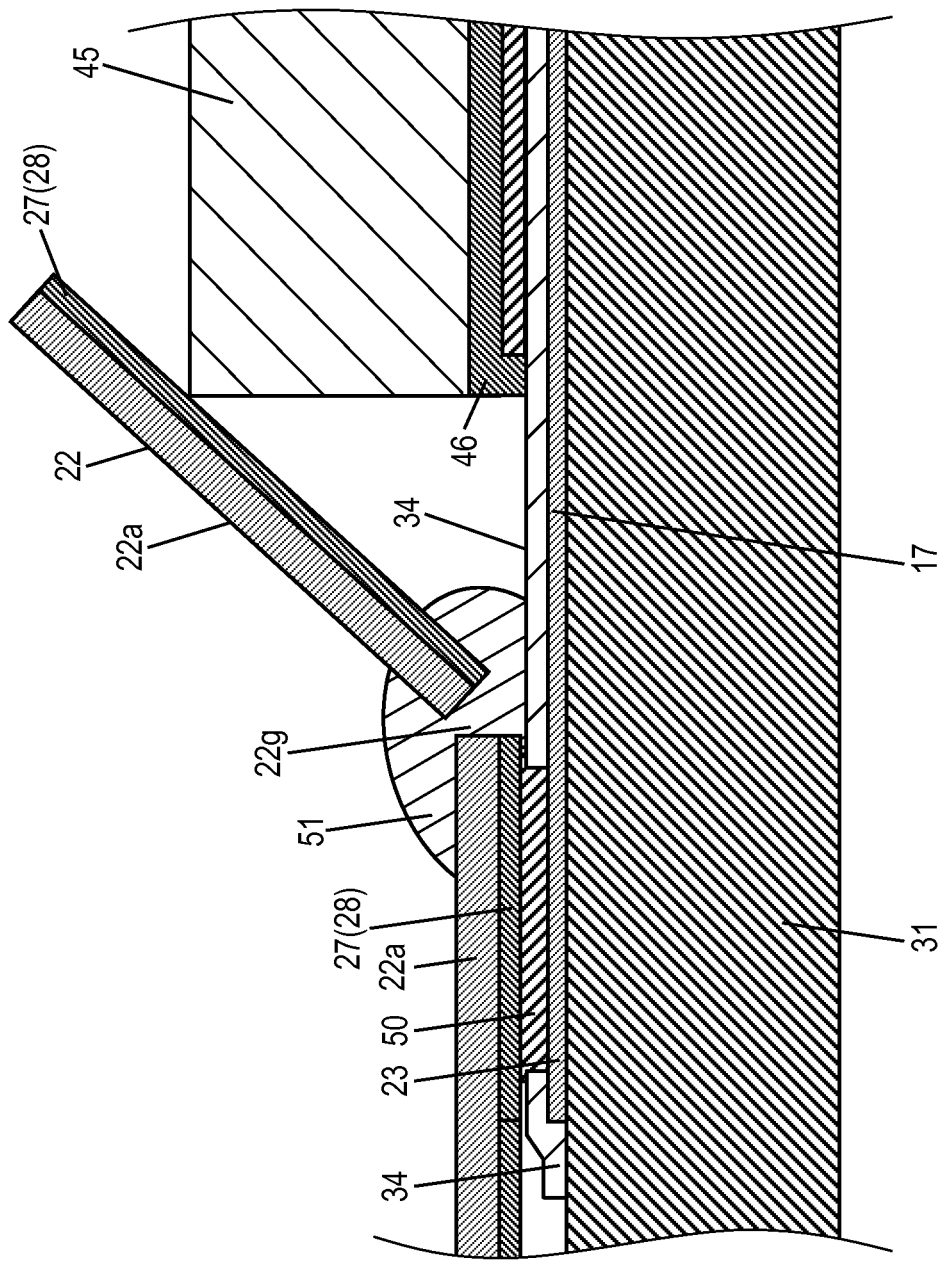
FIG. 19 is a cross sectional view cut along line 19-19 in FIG. 17.

FIGS. 17 to 19 illustrate an example of the connection structure of COF in the EL display panel of FIG. 4. In this connection structure, the panel has seal substrate 45 formed on array substrate 31, where seal substrate 45 has a color filter having predetermined thickness. FIG. 18 is a cross sectional view along 18-18 line of FIG. 17, and FIG. 19 is a cross sectional view along 19-19 line of FIG. 17. Groove 22g of COF 22 of FIG. 17 is formed by punching operation along B-B line of FIG. 10.

As shown in FIGS. 17 to 19, COF 22 is connected to COF connection terminals 25a and 26a at a portion of connection terminal 24 by anisotropically conductive adhesive material 50 electrically and mechanically. COF 22 is also connected to gate signal line 17 at a portion of connection electrode by anisotropically conductive adhesive material 50 electrically and mechanically.

Groove 22g is formed in COF 22 at a portion where anode reinforcement wiring 27 and cathode reinforcement wiring 28 are formed between connection terminals 24. This structure allows anode reinforcement wiring 27 and cathode reinforcement wiring 28 to be bent as illustrated in FIG. 19. Thus, protective resin 51 made of silicon resin is applied to a portion where groove 22g is formed to protect this groove 22g portion.

Figure 20:
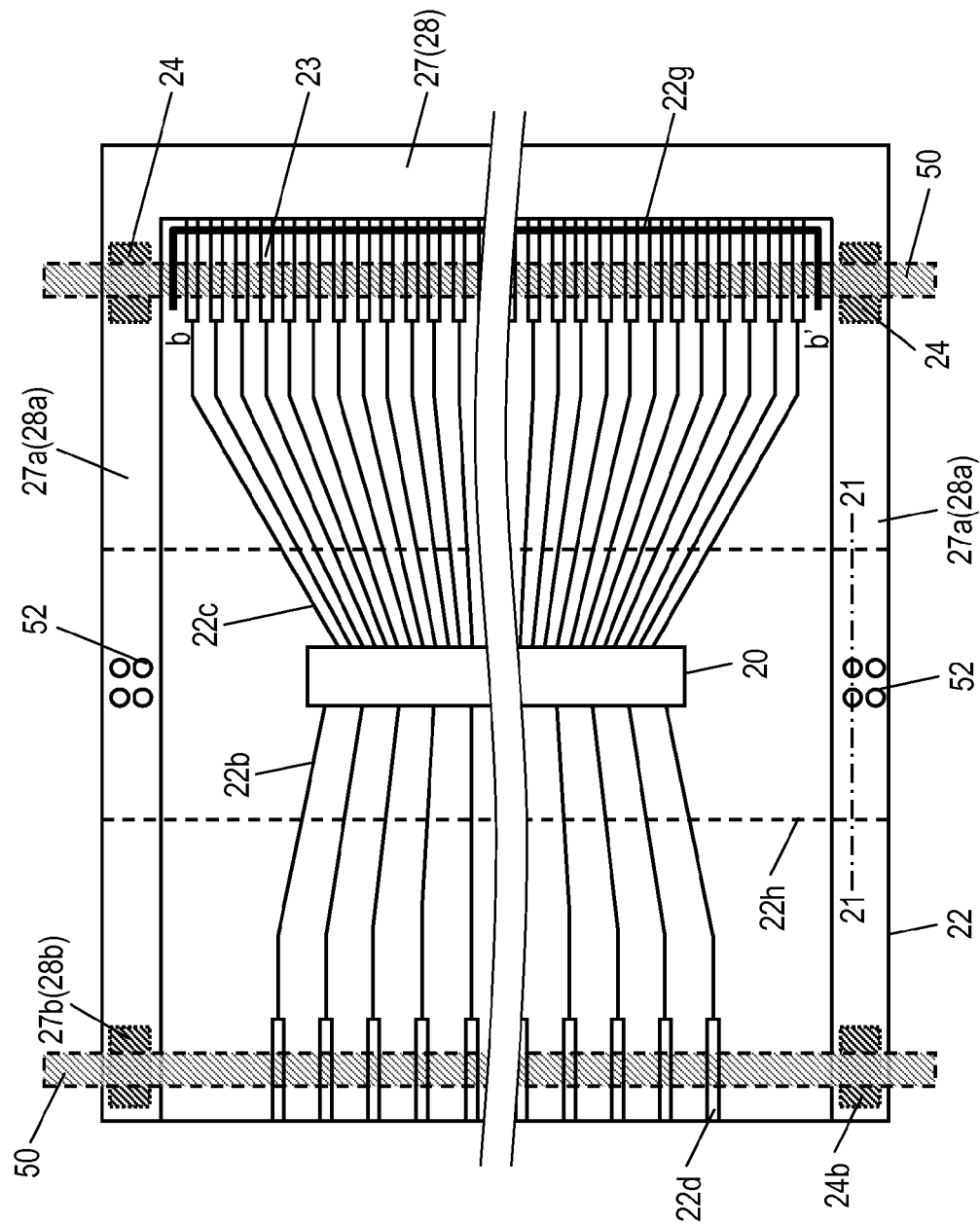
FIG. 20 is a plan view illustrating another example of COF used in an exemplary embodiment.
Figure 21:
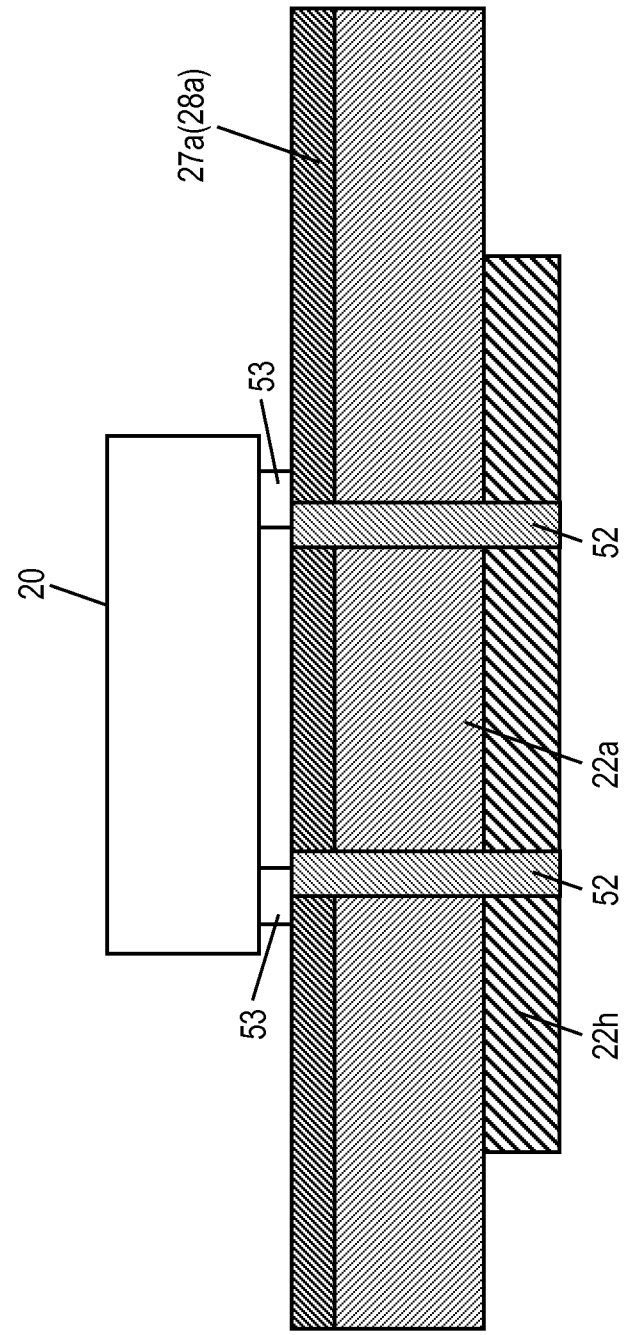
FIG. 21 is a cross sectional view cut along line 21-21 in FIG. 20.

FIG. 20 is a plan view illustrating another example of COF used in one embodiment, and FIG. 21 is a cross sectional view cut along line 21-21 in FIG. 20.

In the example of FIGS. 20 and 21, similarly to the example of FIG. 15, extended wiring portions 27a and 28a are further provided on anode reinforcement wiring 27 and cathode reinforcement wiring 28 of COF 22 (see FIG. 10) so that they extend toward the input side of COF 22 from connection terminal 24. Further, shield electrode 22h is formed on the mounting portion of source driver IC 20, and extended wiring portions 27a, 28a of wirings 27, 28 are connected electrically to shield electrode 22h via through hole 52. FIG. 21 also shows terminal electrodes 53 of source driver IC 20.

The presence of shield electrode 22h on the back surface of source driver IC 20 allows reducing noise. The example of forming shield electrode 22h in source driver IC 20 side is discussed previously; however, use of a similar structure to what is discussed above in COF 22 mounted with gate driver ICs 21a and 21b thereon allows reducing the noise. Heat generated from the driver IC can be radiated efficiently by using shield electrode 22h made of material having an excellent thermal conductivity.

Figure 22:
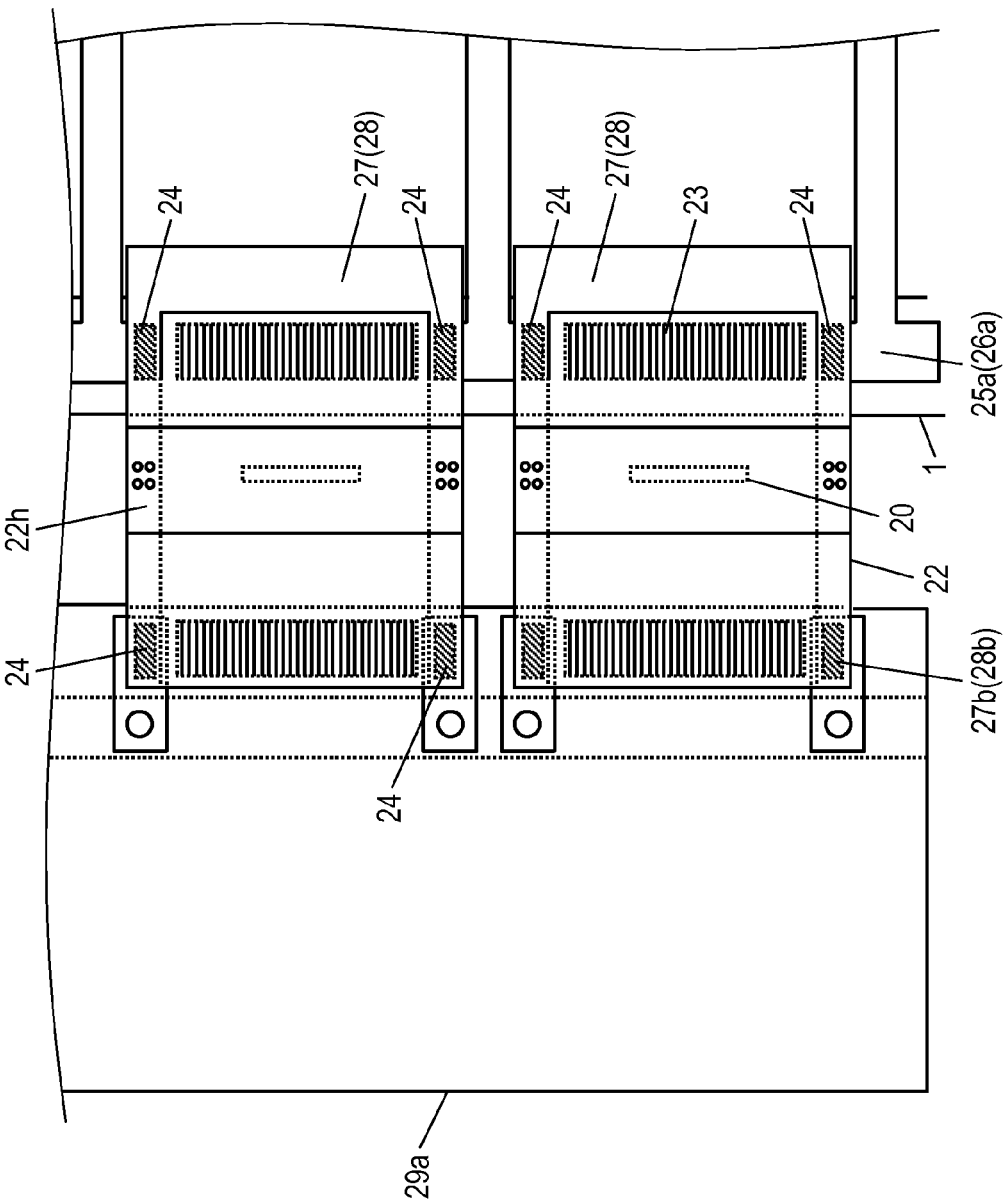
FIG. 22 is an enlarged schematic plan view illustrating a connection portion of an EL display panel and a print circuit board of the COF of FIG. 20.

FIG. 22 is an enlarged schematic plan view of COF of FIG. 20, illustrating a connection portion of the EL display panel and the printed circuit board.

In the above, examples of COF used in one embodiment is discussed. Instead of the wiring structure of EL display of FIG. 5, structures illustrated in FIG. 23 or 24 can be employed.

Figure 23:
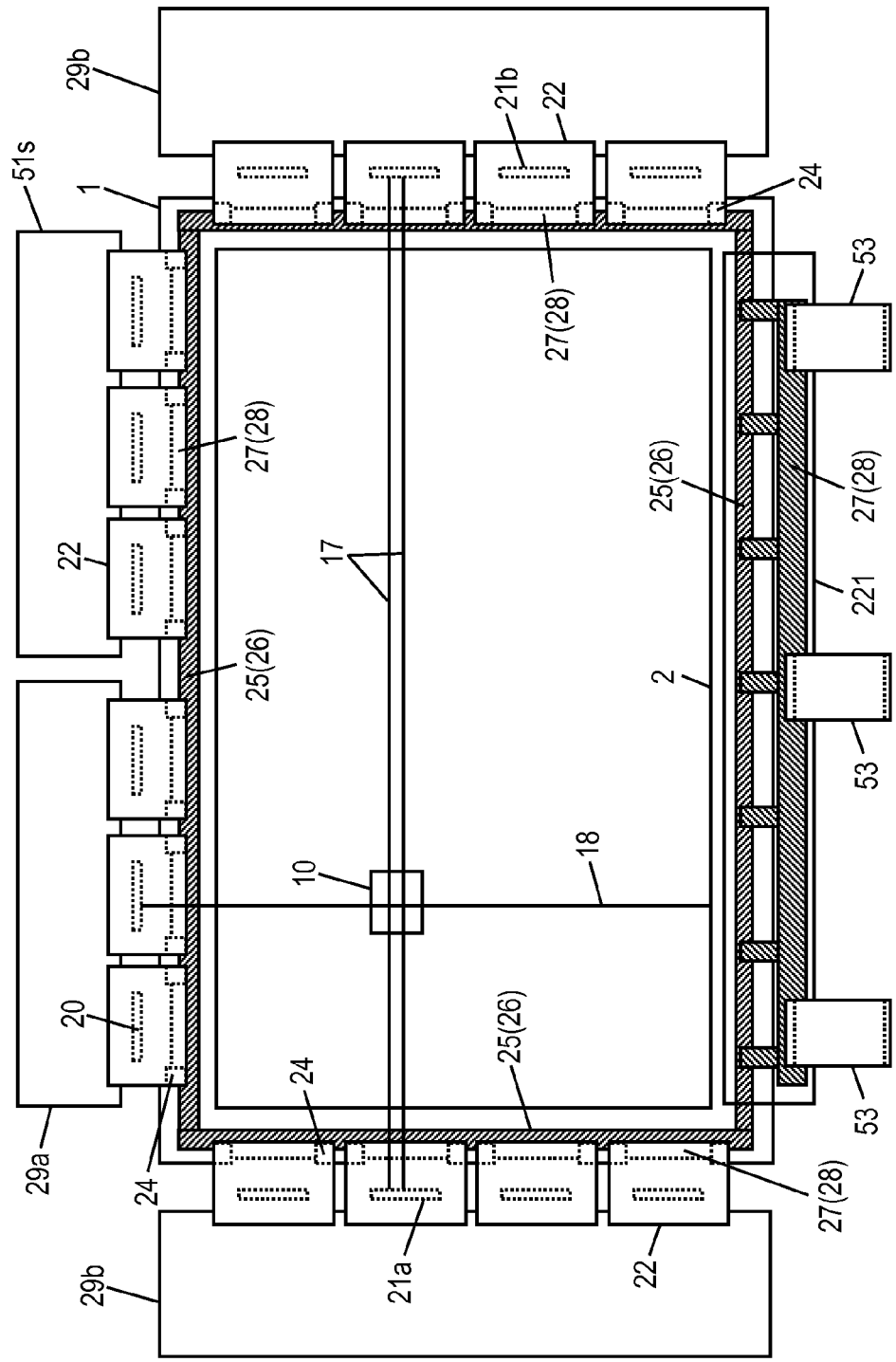
FIG. 23 is a plan view illustrating another example of connection structure of EL display device according to an exemplary embodiment.

In the example of FIG. 23, gate driver IC 21a is connected to one end of gate signal line 17 and gate driver IC 21b is connected to the other end. Further, voltage supply substrate 53 for applying anode voltage Vdd and cathode voltage Vss is connected to COF 221, where COF 221 is a wiring substrate only having anode reinforcement wiring 27 and cathode reinforcement wiring 28 thereon.

Figure 24:
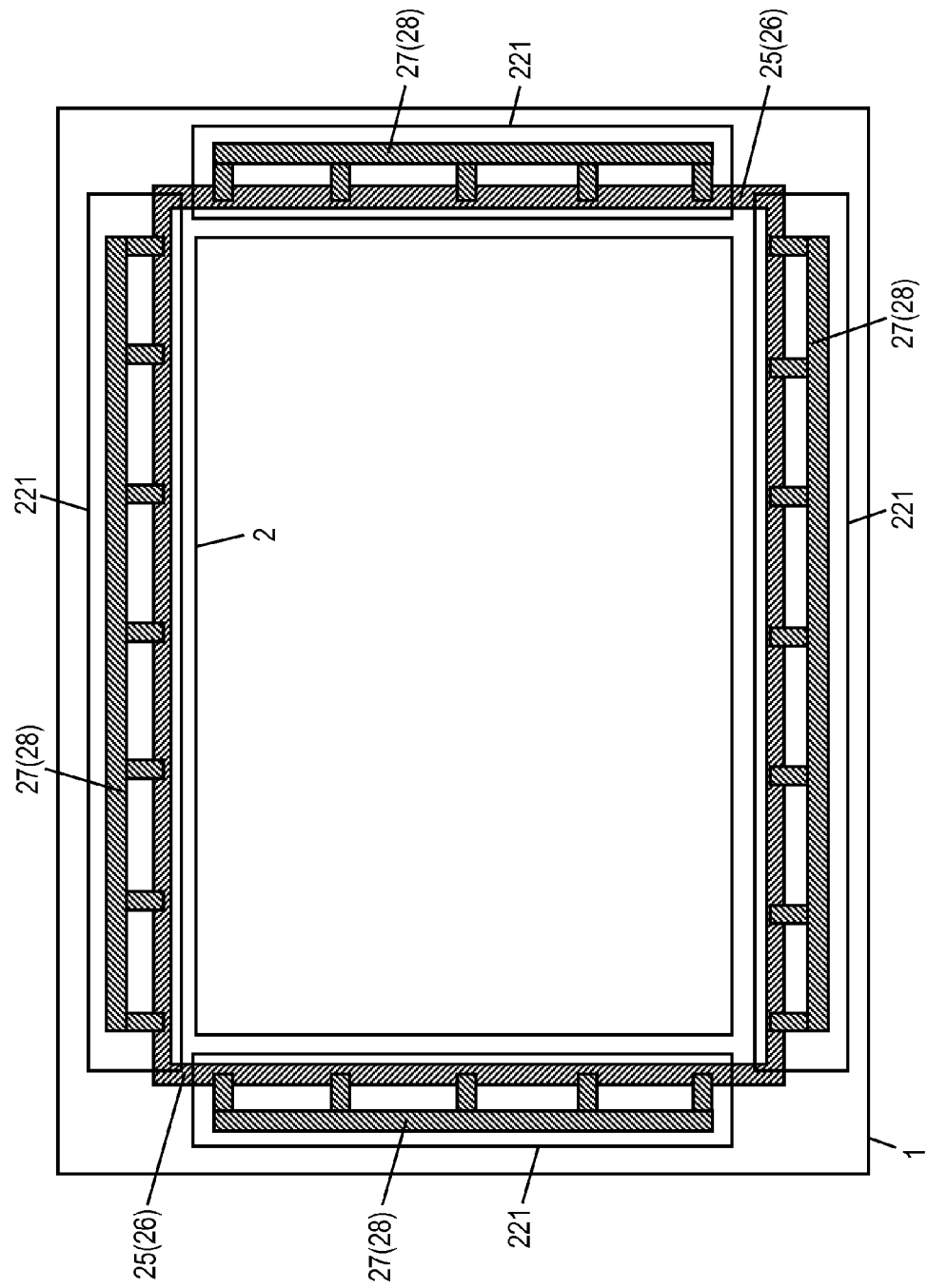
FIG. 24 is a plan view illustrating another example of connection structure of EL display device according to an exemplary embodiment.

Further, FIG. 24 relates to an example having COF 221 provided additionally to COF 22 connected to source signal line or gate signal line, where COF 221 is a wiring substrate only having wirings 27 and 28 in the peripheral of four sides of EL display panel 1. A reinforcement wiring pattern of COF 221 is also connected electrically parallel to anode ring 25 and cathode ring 26 which are the wiring patterns for supplying voltage to the pixel 10.

As discussed above, in the EL display device of one embodiment, at least one of anode ring 25 and cathode ring 26, formed in the circumference of display area 2 of EL display panel 1, is connected electrically parallel to at least one of anode reinforcement wiring 27 and cathode reinforcement wiring 28 formed on COF 22 and 221. The current-flow in a wiring pattern around display area 2 is branched to the reinforcement wiring pattern. Thus, sheet resistance values of the reinforcement wiring patterns, formed in COF 22 and COF 221, can be lowered easily. As a result, the width of wiring patterns in the circumference of display area 2 can be narrowed and size of display area 2 occupying some portion in the EL display panel can be enlarged. Further, meltdown of the wirings due to excessive current-flow can be prevented in EL display panel 1, and an electronic wiring of high reliability can be achieved.

The present disclosure is applicable to various electronic devices having display device such as video camera, digital camera, goggle display, navigation system, sound reproducing device (car audio, audio component stereo), computer, game machine, and PDA (Personal Digital Assistant), and can improve performance of these electronic devices.

INDUSTRIAL APPLICABILITY

The present disclosure is useful for improving performance of EL display devices.

The invention claimed is:

1. An EL display device including:
an EL display panel comprising a display area where pixels are arranged in matrix, a source signal line supplying an image signal to the pixels, a gate signal line supplying a signal for controlling selection or non-selection of luminescence of the pixels, and a wiring pattern formed in a circumferential portion of the display area for supplying voltage to the pixels; and
a wiring substrate attached to a peripheral portion of the EL display panel, wherein:
the wiring substrate is a separate element from the EL display panel,
the wiring substrate does not overlap the display area, and
the wiring substrate comprises:
  a reinforcement wiring pattern which is electrically in parallel to the wiring pattern; and
  a connection terminal which electrically connects the reinforcement wiring pattern to the wiring pattern of the EL display panel.

2. An EL display device including:
an EL display panel comprising a display area where pixels are arranged in matrix, a source signal line supplying an image signal to the pixel, a gate signal line supplying a signal for controlling selection or non-selection of luminescence of the pixel, and a wiring pattern formed in a circumferential portion of the display area for supplying voltage to the pixel; and
a wiring substrate attached to the EL display panel and equipped with a connection electrode connected to the source signal line or the gate signal line of the EL display panel, wherein:
the wiring substrate is a separate element from the EL display panel,
the wiring substrate does not overlap the display area,
the wiring substrate comprises:
  a reinforcement wiring pattern which is electrically in parallel to the wiring pattern; and
  a connection terminal which electrically connects the reinforcement wiring pattern to the wiring pattern of the EL display panel, and
the wiring substrate connects the reinforcement wiring pattern electrically in parallel to the wiring pattern.

3. An EL display device including:
an EL display panel comprising a display area where pixels are arranged in matrix, a source signal line supplying an image signal to the pixel, a gate signal line supplying a signal for controlling selection or non-selection of luminescence of the pixel, and a wiring pattern formed in a circumferential portion of the display area for supplying voltage to the pixel; and
a first and a second wiring substrates attached to a peripheral portion of the EL display panel, wherein:
the first and second wiring substrates are separate elements from the EL display panel,
the first and second wiring substrates do not overlap the display area,
the first wiring substrate comprises a connection electrode connected to the source signal line or the gate signal line of the EL display panel, and
the second wiring substrate comprises a reinforcement wiring pattern and a connection terminal, the connection terminal electrically connecting the reinforcement wiring pattern in parallel to the wiring pattern of the EL display panel.

4. The EL display devices of claim 2, wherein the wiring substrate includes a flexible substrate which is mounted with a driver IC supplying a signal to the source signal line or a gate signal line, and the wiring substrate is disposed electrically separated from the connection terminal which is connected to the wiring pattern.

5. The EL display devices of claim 1, wherein the wiring pattern of the EL display panel supplies one of anode voltage and cathode voltage to the pixel.

6. The EL display devices of claim 5, wherein the wiring pattern is formed in a ring shape in the circumference of the display area.

7. The EL display devices of claim 1, wherein the EL display panel comprises a glass substrate and the wiring substrate includes a flexible substrate.

8. The EL display devices of claim 2, wherein the EL display panel comprises a glass substrate and the wiring substrate includes a flexible substrate.

9. The EL display devices of claim 3, wherein the EL display panel comprises a glass substrate and the wiring substrate includes a flexible substrate.

\* \* \* \* \*